(12) United States Patent
Jeong et al.

(10) Patent No.: US 11,499,936 B2
(45) Date of Patent: Nov. 15, 2022

(54) SENSOR UNIT, DISPLAY DEVICE INCLUDING THE SENSOR UNIT AND METHOD FOR DETECTING CRACKS

(71) Applicant: Samsung Display Co., Ltd., Yongin-si (KR)

(72) Inventors: Il Hun Jeong, Yongin-si (KR); Yeon Shil Jung, Cheonan-si (KR); Hwan Woo Lee, Hwaseong-si (KR); Hae Goo Jung, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 225 days.

(21) Appl. No.: 16/696,071

(22) Filed: Nov. 26, 2019

(65) Prior Publication Data

US 2020/0278312 A1 Sep. 3, 2020

(30) Foreign Application Priority Data

Feb. 28, 2019 (KR) .......................... 10-2019-0023910

(51) Int. Cl.
| | | |
|---|---|---|
| *G01N 27/24* | (2006.01) | |
| *H01L 27/32* | (2006.01) | |
| *G01D 5/24* | (2006.01) | |
| *G01R 31/28* | (2006.01) | |
| *G01N 27/20* | (2006.01) | |
| *H01L 51/52* | (2006.01) | |

(52) U.S. Cl.
CPC .............. *G01N 27/24* (2013.01); *G01D 5/24* (2013.01); *G01N 27/20* (2013.01); *G01R 31/2837* (2013.01); *H01L 27/3225* (2013.01); *H01L 27/3244* (2013.01); *H01L 51/5253* (2013.01)

(58) Field of Classification Search
CPC ................. H01L 27/32; H01L 27/3225; H01L 27/323; G01N 27/20; G01N 27/24; G01R 31/2832; G01R 31/2836; G01R 31/2837; G01D 5/24; G06F 3/0443; G06F 3/0446; G09G 3/006
See application file for complete search history.

(56) References Cited

U.S. PATENT DOCUMENTS

| | | | | |
|---|---|---|---|---|
| 2002/0101173 | A1* | 8/2002 | Tsai ........................ | G09G 3/298 315/169.3 |
| 2010/0244705 | A1* | 9/2010 | Hajjar ..................... | G09G 3/006 315/129 |
| 2011/0227848 | A1* | 9/2011 | Furusawa ............. | G06F 1/1643 345/173 |
| 2014/0176844 | A1* | 6/2014 | Yanagisawa .......... | G02F 1/1309 349/43 |
| 2014/0340597 | A1* | 11/2014 | Sato ..................... | G02F 1/13338 349/12 |
| 2015/0002428 | A1* | 1/2015 | Shin .................. | G06F 3/041661 345/173 |
| 2016/0232826 | A1* | 8/2016 | Cho .................... | H01L 27/3276 |

(Continued)

*Primary Examiner* — Huy Q Phan
*Assistant Examiner* — David B Frederiksen
(74) *Attorney, Agent, or Firm* — Lewis Roca Rothgerber Christie LLP

(57) ABSTRACT

A sensor includes: a hole; a sensing area formed around the hole, wherein at least one sensor is in the sensing area; and a crack detector configured to output a first crack signal if a comparison value obtained by comparing a detected value from the at least one sensor with a reference value exceeds an error range.

20 Claims, 23 Drawing Sheets

(56) References Cited

U.S. PATENT DOCUMENTS

| | | | |
|---|---|---|---|
| 2016/0322451 A1* | 11/2016 | Park | G09G 3/006 |
| 2016/0351093 A1* | 12/2016 | Kim | G09G 3/006 |
| 2018/0033355 A1* | 2/2018 | Lee | H01L 27/3276 |
| 2018/0088713 A1* | 3/2018 | Yang | G06F 3/0443 |
| 2018/0158894 A1 | 6/2018 | Park et al. | |
| 2018/0182274 A1 | 6/2018 | Jung et al. | |
| 2018/0350284 A1* | 12/2018 | Park | G09G 3/006 |
| 2019/0302956 A1* | 10/2019 | Hirai | G01D 5/24 |

\* cited by examiner

SC: TE, RE, BE1, BE2

FIG. 19
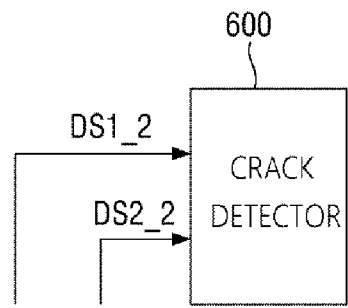
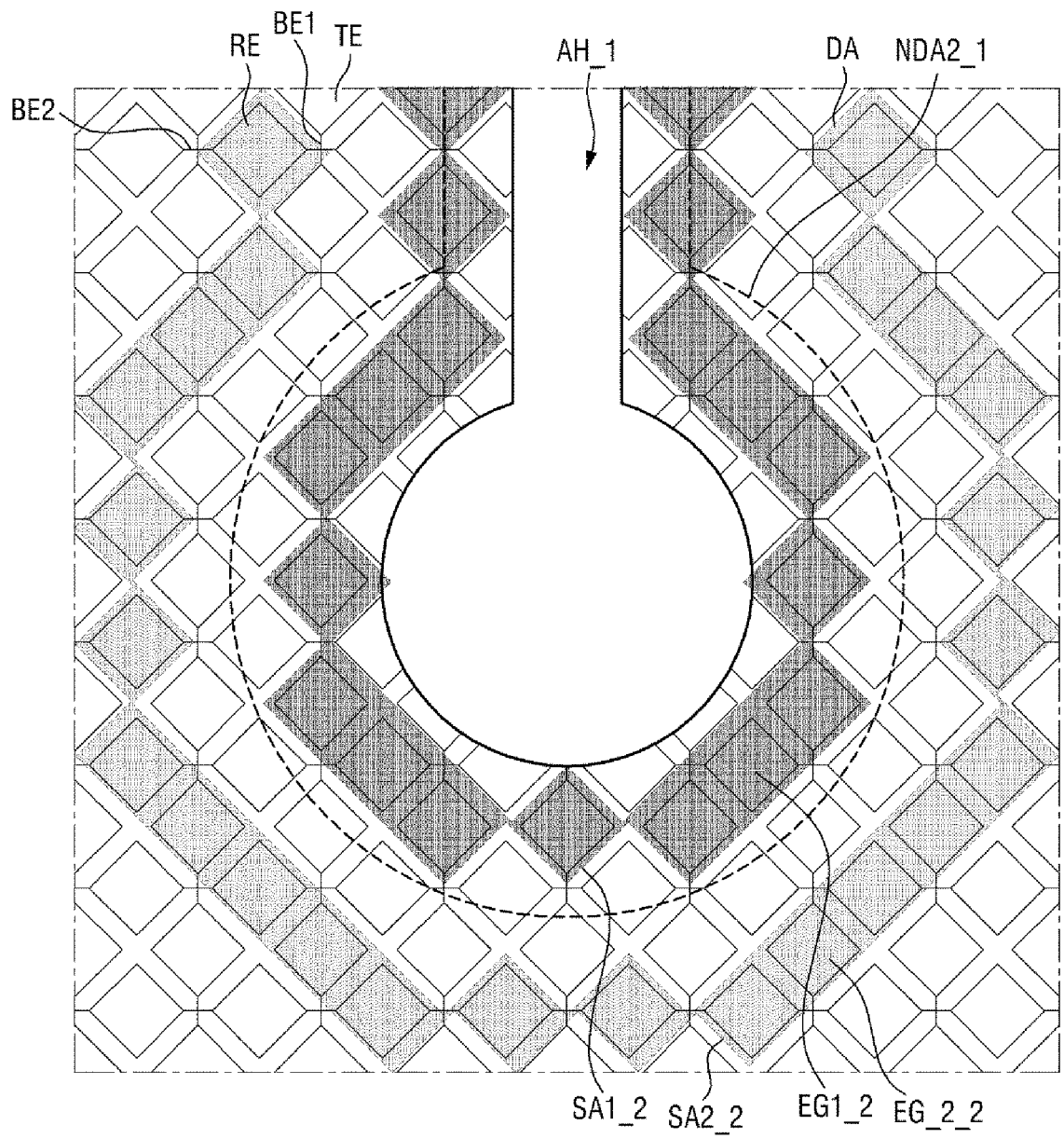

FIG. 23
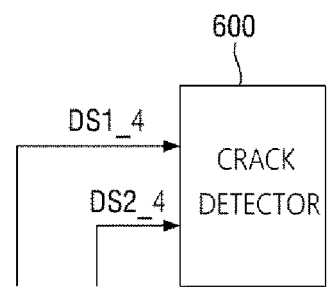
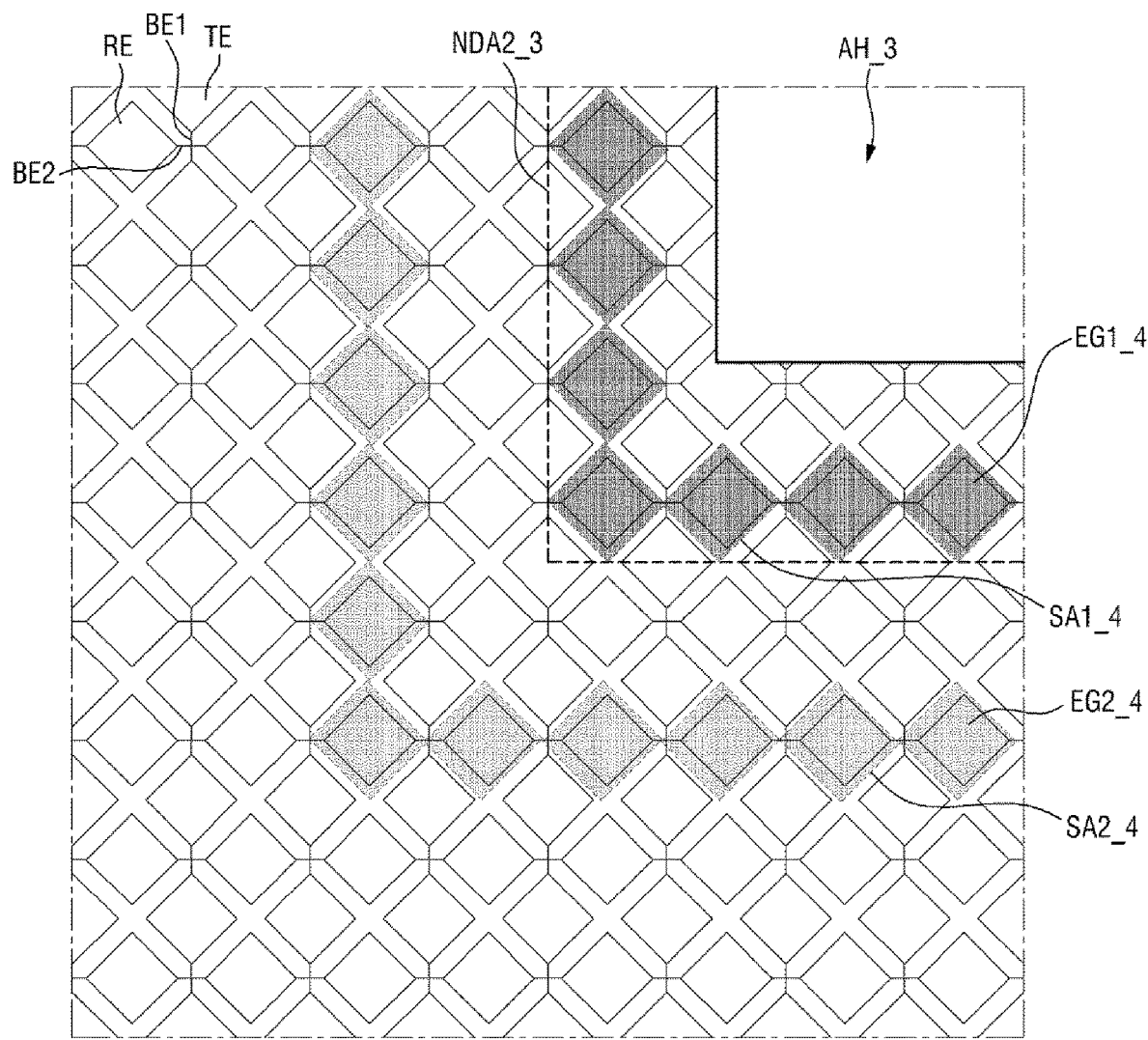

SENSOR UNIT, DISPLAY DEVICE INCLUDING THE SENSOR UNIT AND METHOD FOR DETECTING CRACKS

CROSS-REFERENCE TO RELATED APPLICATION

This application claims priority to and the benefit of Korean Patent Application No. 10-2019-0023910 filed on Feb. 28, 2019, the entirety of which is incorporated herein by reference.

BACKGROUND

1. Field

Aspects of some example embodiments of the present disclosure relate to a sensor unit, a display device including the same, and a method for detecting cracks using the same.

2. Description of the Related Art

As the information-oriented society evolves, various demands for display devices are ever increasing. Accordingly, a variety of types of display devices such as a liquid-crystal display (LCD) device, a plasma display panel (PDP) device, and an organic light-emitting display (OLED) device may be utilized.

In order to expand the display area, a display device may include a hole in the display area, in which a sensor such as a camera device is located.

During the process of forming such a hole in the display device, fine cracks may occur in the substrate of the display device or a layer stacked thereon. When this happens, moisture or the like may permeate into the display device through the cracks, which may impair the functionality of the display device due to, for example, the pixels of the display device failing to emit light, incorrect or undesired pixels emitting light, and so on.

The above information disclosed in this Background section is only for enhancement of understanding of the background and therefore it may contain information that does not constitute prior art.

SUMMARY

Aspects of some example embodiments of the present disclosure include a sensor unit, a display device including the same, and a method for detecting cracks using the same.

It should be noted that embodiments of the present disclosure are not limited to the above-mentioned characteristics; and other characteristics of the present invention will be more apparent to those skilled in the art from the following descriptions.

Some example embodiments of the present invention include a sensor. The sensor comprising: a hole; a sensing area formed around the hole, wherein at least one sensor is in the sensing area; and a crack detector configured to output a first crack signal if a comparison value obtained by comparing a detected value from the at least one sensor with a reference value exceeds an error range.

According to some example embodiments of the present disclosure, a crack can be detected which may occur during the process of forming a hole in a display device, allowing for easily determining whether or not there is a defect in the display device. The sensor unit can sense a user's touch as well.

According to some example embodiments of the present disclosure, a region where a crack is likely to occur during the process of forming a hole is set as a sensing area, and thus it may be possible to efficiently detect the crack to determine whether or not there is a defect. In addition, it is possible to set more than one sensing areas to detect a crack, thereby determining whether or not there is a crack causing a defect in a display device. Moreover, it may be possible to determine whether or not a crack is expanded and when a crack has occurred by performing detection at a number of time points.

It should be noted that effects of the present disclosure are not limited to those described above and other effects of the present disclosure will be apparent to those skilled in the art from the following descriptions.

BRIEF DESCRIPTION OF THE DRAWINGS

The accompanying drawings, which are included to provide a further understanding of the invention and are incorporated in and constitute a part of this specification, illustrate aspects of some example embodiments of the invention, and together with the description serve to explain the inventive concepts.

FIG. 19 is a view schematically showing a region in which a hole is formed and a crack detector according to some example embodiments of the present disclosure.

FIG. 23 is a view schematically showing a region in which a hole is formed and a crack detector according to some example embodiments of the present disclosure.

DETAILED DESCRIPTION

Figure 1:
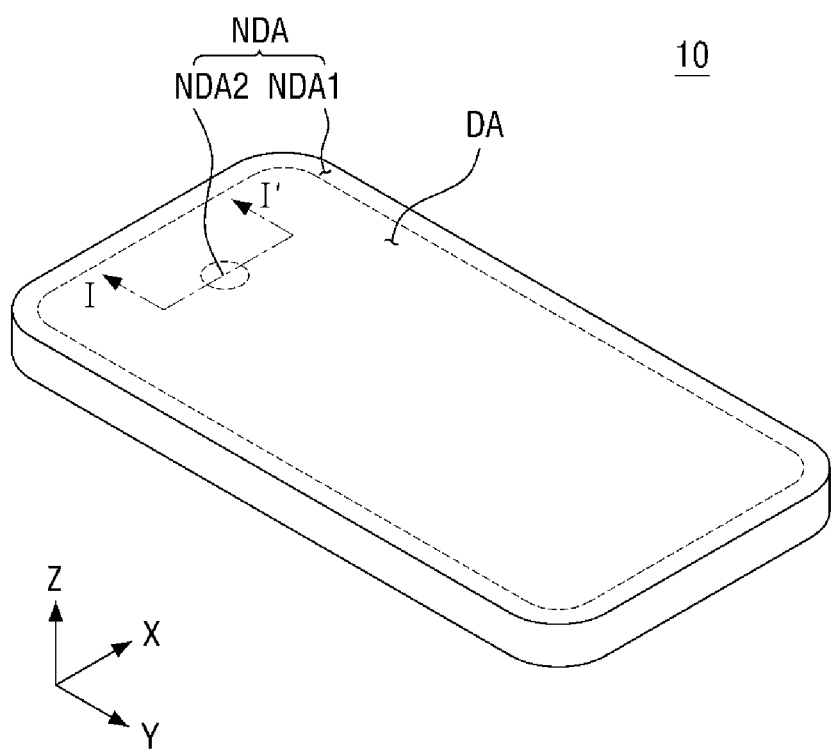
FIG. 1 is a perspective view of a display device according to some example embodiments of the present disclosure.

In the following description, for the purposes of explanation, various details are set forth in order to provide a more thorough understanding of various example embodiments of the invention. As used herein "embodiments" are non-limiting examples of devices or methods employing one or more of the inventive concepts disclosed herein. It is apparent, however, that various example embodiments may be practiced without these specific details or with one or more equivalent arrangements. In other instances, well-known structures and devices are shown in block diagram form in order to avoid unnecessarily obscuring various example embodiments. Further, various example embodiments may be different, but do not have to be exclusive. For example, specific shapes, configurations, and characteristics of an example embodiment may be used or implemented in another example embodiment without departing from the inventive concepts.

Unless otherwise specified, the illustrated example embodiments are to be understood as providing example features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an example embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various example embodiments are described herein with reference to sectional and/or exploded illustrations that are schematic illustrations of example embodiments and/or intermediate structures. As such, variations from the shapes of the illustrations as a result, for example, of manufacturing techniques and/or tolerances, are to be expected. Thus, example embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some example embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some example embodiments may be physically separated into two or more interacting and discrete blocks, units, and/or modules without departing from the scope of the inventive concepts. Further, the blocks, units, and/or modules of some example embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

It will be apparent to those skilled in the art that various modifications and variations can be made to the disclosed embodiments without departing from the spirit and scope of the inventive concepts. Thus, it is intended that the inventive concepts cover the modifications and variations of the disclosed embodiments provided they come within the scope of the appended claims and their equivalents.

Throughout the specification, the same reference numerals are used for the same or similar elements.

Hereinafter, aspects of some example embodiments of the present disclosure will be described with reference to the accompanying drawings.

Figure 2:
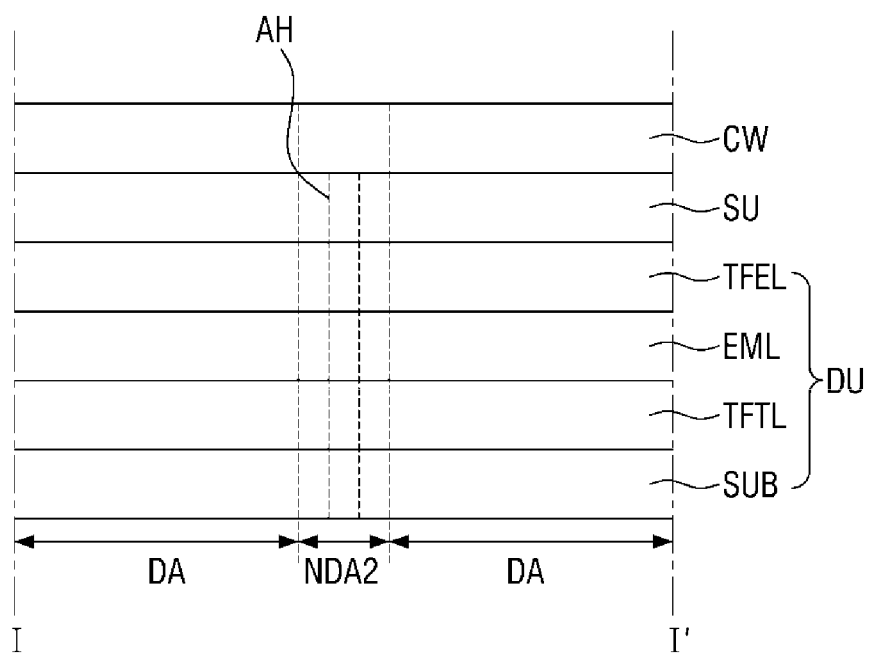
FIG. 2 is a cross-sectional view taken along the line I-I' of FIG. 1.

FIG. 1 is a perspective view of a display device according to some example embodiments of the present disclosure. FIG. 2 is a cross-sectional view taken along the line I-I' of FIG. 1.

Referring to FIGS. 1 to 2, a display device 10 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook, a monitor, a billboard and the Internet of Things.

The display device 10 may be one of an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device is described as an example of the display device 10. It is, however, to be understood that the present disclosure is not limited thereto.

As used herein, the terms "above," "top" and "upper surface" refer to the upper side of the display device 10, i.e., the side indicated by the arrow in the z-axis direction, whereas the terms "below," "bottom" and "lower surface" refer to the lower side of the display device 10, i.e., the opposite side in the z-axis direction. As used herein, the terms "left," "right," "upper" and "lower" sides indicate relative positions when the display device 10 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

The display device 10 may be formed in a rectangular plane having shorter sides in a first direction (x-axis direction) and longer sides in a second direction (y-axis direction) intersecting the first direction (x-axis direction). The corners where the shorter sides in the first direction (x-axis direction) meet the longer sides in the second direction (y-axis direction) may be rounded with a curvature (e.g., a predetermined curvature). Although the display device 10 shown in FIG. 1 has a rectangular shape with rounded corners when viewed from the top, this is merely illustrative. The display device 10 may have any other polygonal shape, a circular shape or an ellipse shape.

The display device 10 may include a display area DA and a non-display area NDA.

In the display area DA, a plurality of pixels are arranged, for example, in a matrix arrangement to enable an image to be displayed. According to some example embodiments, the display area DA may include emission areas of different colors, and one emission area may be associated with a single pixel. The display area DA may also be used as an area for recognizing a user's touch input as well as the area for displaying images.

The non-display area NDA is defined as an area where no image is displayed. According to some example embodiments, the non-display area NDA includes a first non-display area NDA1 surrounding the display area DA, and a second non-display area NDA2 located inside the display area DA. It is, however, to be understood that the present disclosure is not limited thereto. The shape of the display area DA and the shape of the first non-display area NDA1 may be relatively designed. In some parts of the first non-display area NDA1, a speaker module, a camera module, etc. may be positioned.

According to some example embodiments, the periphery of the second non-display area NDA2 may be surrounded by the display area DA. In other words, the second non-display area NDA2 may be located inside the display area DA. It is, however, to be understood that the present disclosure is not limited thereto. According to some example embodiments, a part of the second non-display area NDA2 may be surrounded by the display area DA and another part of the second non-display area NDA2 may be connected to the first non-display area NDA1.

The second non-display area NDA2 is defined as an area where no image is displayed. Although the second non-display area NDA2 has a circular shape when viewed from the top in the example shown in FIG. 1, this is merely illustrative. The second non-display area NDA2 may have any of a variety of shapes such as an elliptical space and a polygonal shape.

Referring to FIG. 2, the display device 10 may include a display unit DU having a hole AH, a substrate SUB, a thin-film transistor layer TFTL arranged on the substrate SUB, a light-emitting element layer EML and a thin-film encapsulation layer TFEL; a sensor unit SU; and a cover window CW.

The hole AH may be formed in the second non-display area NDA2 of the display device 10. For example, the second non-display area NDA2 and the hole AH may overlap with one another in the third direction (z-axis direction). According to some example embodiments, the width of the hole AH in the first direction (x-axis direction) may be smaller than the width of the second non-display area NDA2 in the first direction (x-axis direction) in the cross section. It is, however, to be understood that embodiments of the present disclosure are not limited thereto. The width of the hole AH in the first direction (x-axis direction) may be equal to the width of the second non-display area NDA2 in the first direction (x-axis direction) in the cross section.

According to some example embodiments, the shape of the hole AH may conform to the shape of the second non-display area NDA2 when viewed from the top. For example, when the second non-display area NDA2 has a circular shape when viewed from the top, the hole AH may also have a circular shape when viewed from the top. It is, however, to be understood that the present disclosure is not limited thereto. The shape of the hole AH may be different from the shape of the second non-display area NDA2 when viewed from the top.

According to some example embodiments, a camera module and a sensor module may be located in the hole AH. The sensor module may include at least one of an illuminance sensor, a proximity sensor, an infrared sensor, and an ultrasonic sensor. Because the camera module and the sensor module are located inside the hole AH, the display area DA can be expanded to the region surrounding the camera module and the sensor module.

The substrate SUB may be made of an insulating material such as glass, quartz and a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. Alternatively, the substrate SUB may include a metallic material.

The substrate SUB may be a rigid substrate or a flexible substrate that can be bent, folded, rolled, and so on. When the substrate SUB is a flexible substrate, it may be formed of, but is not limited to, polyimide (PI).

Figure 3:
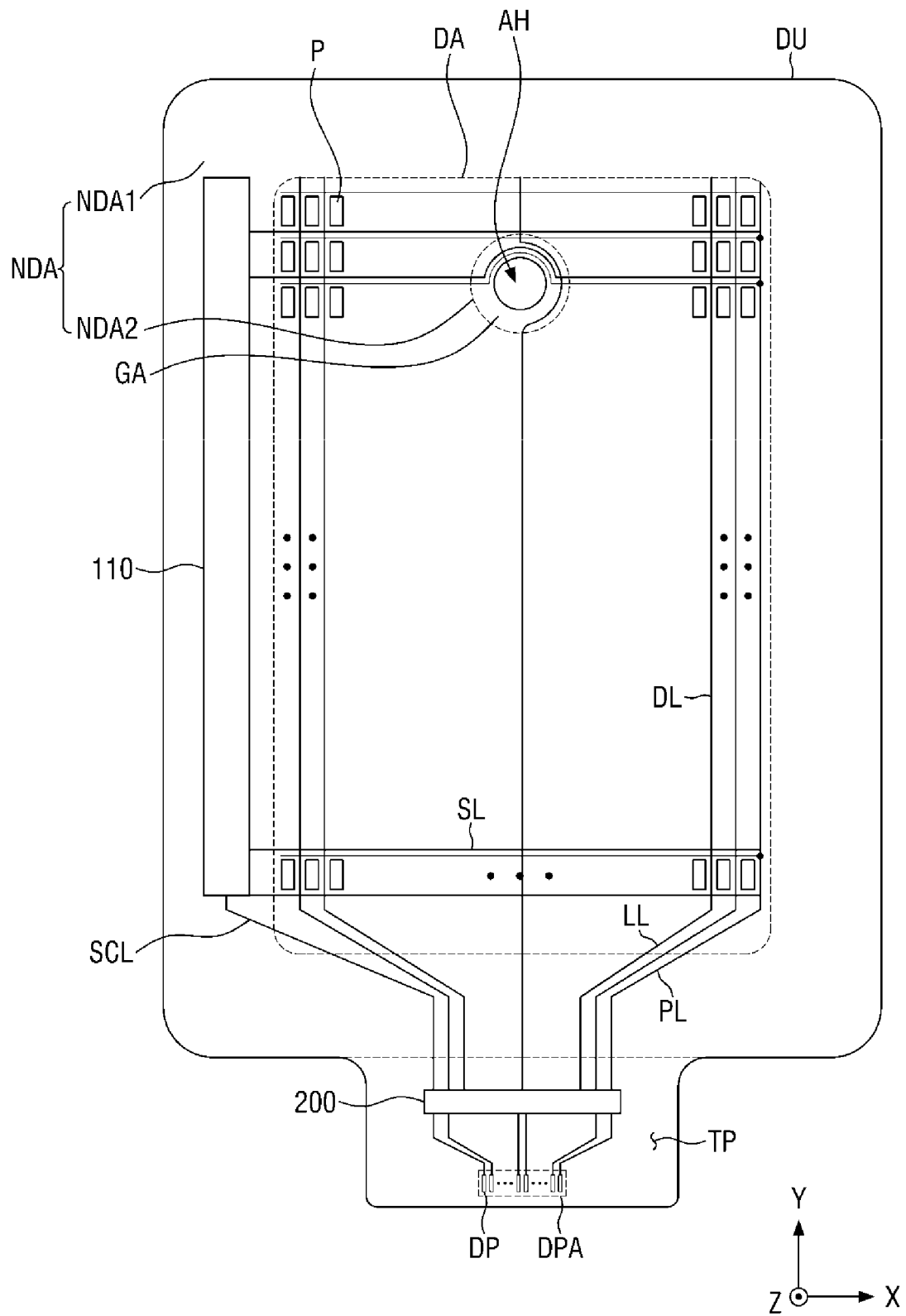
FIG. 3 is a view showing an example of the display unit of FIG. 2 according to some example embodiments of the present disclosure.

The thin-film transistor layer TFTL may be located on the substrate SUB. On the thin-film transistor layer TFTL, scan lines, data lines, power lines, scan control lines, routing lines connecting the pads with the data lines may be formed as well as thin-film transistors in the pixels. Each of the thin-film transistors may include a gate electrode, a semiconductor layer, a source electrode and a drain electrode. When the scan driver 110 is formed in the non-display area NDA of the display unit DU as shown in FIG. 3, the scan driver 110 may include thin-film transistors.

The thin-film transistor layer TFTL may be located in the display area DA and the non-display area NDA. For example, the thin-film transistors in the pixels, the scan lines, the data lines, and the power lines on the thin-film film transistor layer TFTL may be located in the display area DA. The scan control lines and the link lines on the thin-film transistor layer TFTL may be located in the non-display area NDA.

The light-emitting element layer EML may be located on the thin-film transistor layer TFTL. The light-emitting element layer EML may include pixels including a first electrode, an emissive layer and a second electrode, and a pixel-defining layer. The emissive layer may be an organic emissive layer containing an organic material. Then, the emissive layer may include a hole transporting layer, an organic light-emitting layer and an electron transporting layer. When a voltage is applied to the first electrode and a cathode voltage is applied to the second electrode through the thin-film transistor on the thin-film transistor layer TFTL, the holes and electrons move to the organic light-emitting layer through the hole transporting layer and the electron transporting layer, respectively, such that they combine in the organic light-emitting layer to emit light. The pixels on the light-emitting element layer EML may be located in the display area DA.

The thin-film encapsulation layer TFEL may be located on the light-emitting element layer EML. The thin-film encapsulation layer TFEL serves to prevent or reduce instances of oxygen or moisture permeating into the light-emitting element layer EML. To this end, the thin-film encapsulation layer TFEL may include at least one inorganic layer. The inorganic layer may be, but not limited to, a silicon nitride layer, a silicon oxynitride layer, a silicon oxide layer, a titanium oxide layer, or an aluminum oxide layer. In addition, the thin-film encapsulation layer TFEL protects the light-emitting element layer EML from foreign substances such as dust. To this end, the thin-film encapsulation layer TFEL may include at least one organic layer. The organic layer may be formed of (or include), but is not limited to, an acryl resin, an epoxy resin, a phenolic resin, a polyamide resin, and a polyimide resin.

The thin-film encapsulation layer TFEL may be located in the display area DA except for the hole AH and the non-display area NDA. For example, the thin-film encapsulation layer TFEL may be located in the display area DA, the first non-display area NDA1 and a part of the second non-display area NDA2 to cover the light-emitting element layer EML and the thin-film transistor layer TFTL of the non-display area NDA.

The sensor unit SU may be located on the thin-film encapsulation layer TFEL. The sensor unit SU may perform not only the touch function of the display device 10 but also a function of detecting a crack of the display device 10. For example, if a crack occurs in the thin-film encapsulation layer TFEL, moisture or the like may permeate into the display unit DU through the crack, such that a pixel of the display unit DU may not emit light or a wrong pixel may emit light erroneously. If a crack occurs in the thin-film encapsulation layer TFEL, it results in a crack in the sensor unit SU as well. Accordingly, the sensor unit SU can sense the crack of the sensor unit SU to detect the crack in the thin-film encapsulation layer TFEL. Thus, it may be possible to relatively easily determine whether or not the display device 10 is defective. In addition, because the sensor unit SU is located directly on the thin-film encapsulation layer TFEL, no additional touch panel or no structure for sensing a crack may be utilized, thereby reducing the thickness of the display device 10 and efficiently utilizing the display area DA. In some example embodiments, the sensor unit SU may be a touch panel.

The sensor unit SU may include sensors for sensing a user's touch and cracks using an electrical signal, pads, and sensor lines for connecting the sensors. For example, the sensor unit SU can sense a user's touch and a crack in the display device 10 based on detected values by self-capacitance sensors or mutual-capacitance sensors.

Figure 5:
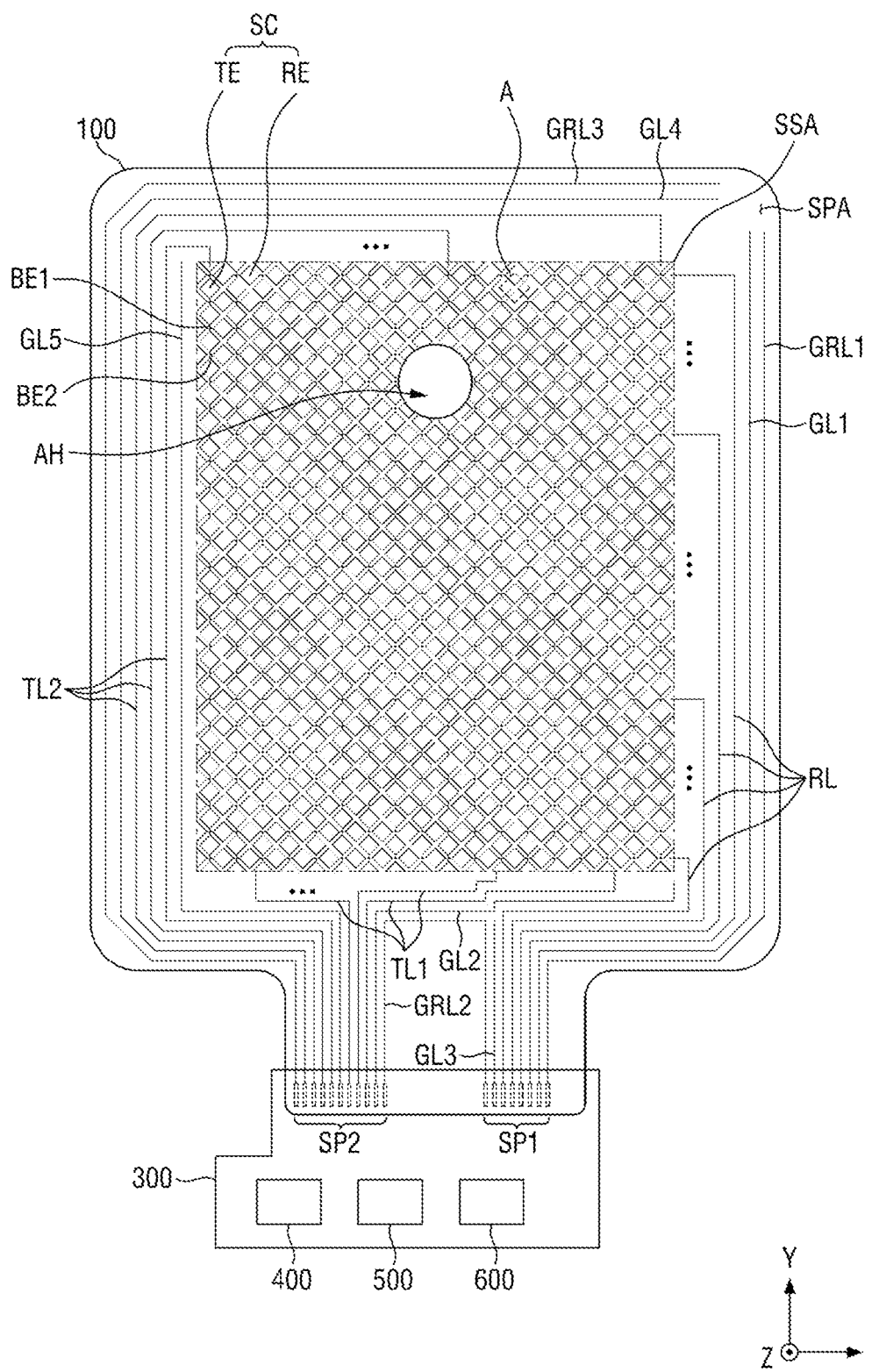
FIG. 5 is a view showing an example of the sensor unit of FIG. 2 according to some example embodiments of the present disclosure.

In some example embodiments, the sensors of the sensor unit SU may be located in the display area DA and in a sensor area SSA that overlaps with the second non-display area NDA2 except the hole AH as shown in FIG. 5. Therefore, when the second non-display area NDA2 is larger than the hole AH, the sensor area SSA may include not only the display area DA but also the portion of the second non-display area NDA2 that does not overlap with the hole AH in the third direction (z-axis direction). The sensor lines of the sensor unit SU may be located in a touch peripheral area SPA overlapping the first non-display area NDA as shown in FIG. 5. The hole AH may penetrate through the display unit DU and the sensor unit SU of the display device 10. For example, the hole AH may be formed in each of the substrate SUB, the thin-film transistor layer TFTL located on the substrate SUB, the light-emitting element layer EML located on the thin-film transistor layer TFTL, the thin-film encapsulation layer TFEL located on the light-emitting element layer EML and the sensor unit SU.

The cover window CW may be located on the sensor unit SU and the hole AH. The cover window CW can protect the display unit DU and the sensor unit SU from scratches or the like. The upper surface of the cover window CW may be the surface on which a user's input means (finger) touches.

According to some example embodiments, the cover window CW may further include a functional coating layer located on the upper surface and/or the lower surface. The functional coating layer may include an anti-fingerprint layer, an anti-reflection layer, and a hard coating layer, etc.

FIG. 3 is a view showing an example of the display unit of FIG. 2 according to some example embodiments.

Referring to FIG. 3, the display unit DU may include pixels P, scan lines SL, data lines DL, a power line PL, scan control lines SCL, a scan driver 110, a display driver circuit 200, display pads DP and an hole AH.

On the display unit DU, the display area DA and the non-display areas NDA1 and NDA2 are defined when viewed from the top. The first non-display area NDA1 may be defined along the border of the display area DA. In addition, the display area DA surrounds the second non-display area NDA2. The display area DA, the first non-display area NDA1 and the second non-display area NDA2 of the display unit DU may correspond to the display area DATA, the first non-display area NDA1 and the second non-display area NDA2 of the display device 10 shown in FIG. 1, respectively.

The pixels P are arranged in the display area DA. The area of the second non-display area NDA2 may be larger than the area that actually occupied by the hole AH when viewed from the top. No pixel P may be located in a gap area formed between the hole AH in the second non-display area NDA2 and the display area DA. Accordingly, the light first the display unit DU may not exit through the gap area GA of the display unit DU.

The scan lines SL are arranged in parallel in the first direction (x-axis direction) and are extended around the hole AH. The data lines DL are arranged in the second direction (y-axis direction) intersecting the first direction (x-axis direction) and are extended around the hole AH. The power line PL may include at least one line in parallel with the data lines DL in the second direction (y-axis direction) and a plurality of lines branching off from the at least one line in the first direction (x-axis direction) and extended around the hole AH. In addition, the scan lines SL, the data lines DL and the power line PL in the gap area GP may be extended around the hole AH. It is, however, to be understood that the present disclosure is not limited thereto. In some example embodiments, the scan lines SL, the data lines DL and the power line PL may be extended around hole AH in the display area DA. In some other example embodiments, the scan lines SL, the data lines DL and the power line PL may be extended around the hole AH throughout the gap area GA and the display area DA.

Each of the pixels P may be connected to at least one of the scan lines SL, one of the data lines DL, and the power line PL. Each of the pixels P may include thin-film transistors including a driving transistor and at least one switching transistor, an organic light-emitting diode, and a capacitor. When a scan signal is applied from the scan line SL, each of the pixels P receives a data voltage of the data line DL and supplies a driving current to the organic light-emitting diode according to the data voltage applied to the gate electrode, so that light is emitted.

The scan driver 110 is connected to the display driver circuit 200 through at least one scan control line SCL. Accordingly, the scan driver 110 may receive the scan control signal of the display driver circuit 200. The scan driver 110 generates scan signals according to a scan control signal and supplies the scan signals to the scan lines SL.

Although the scan driver 110 is formed in the first non-display area NDA1 on the left side of the display area DA in FIG. 3, the present disclosure is not limited thereto. For example, the scan driver 110 may be formed in the first non-display area NDA1 on the left side as well as right side of the display area DA.

The display driver circuit 200 is connected to the display pads DP and receives digital video data and timing signals. The display driver circuit 200 converts the digital video data into analog positive/negative data voltages and supplies them to the data lines DL through the link lines LL. In addition, the display driver circuit 200 generates and supplies a scan control signal for controlling the scan driver 110 through the scan control line SCL. The pixels P to which the data voltages are supplied are selected by the scan signals of the scan driver 110 and the data voltages are supplied to the selected pixels P. The display driver circuit 200 may be implemented as an integrated circuit (IC) and may be attached to the substrate SUB by a chip on glass (COG) technique, a chip on plastic (COP) technique, or an ultrasonic bonding.

Figure 4:
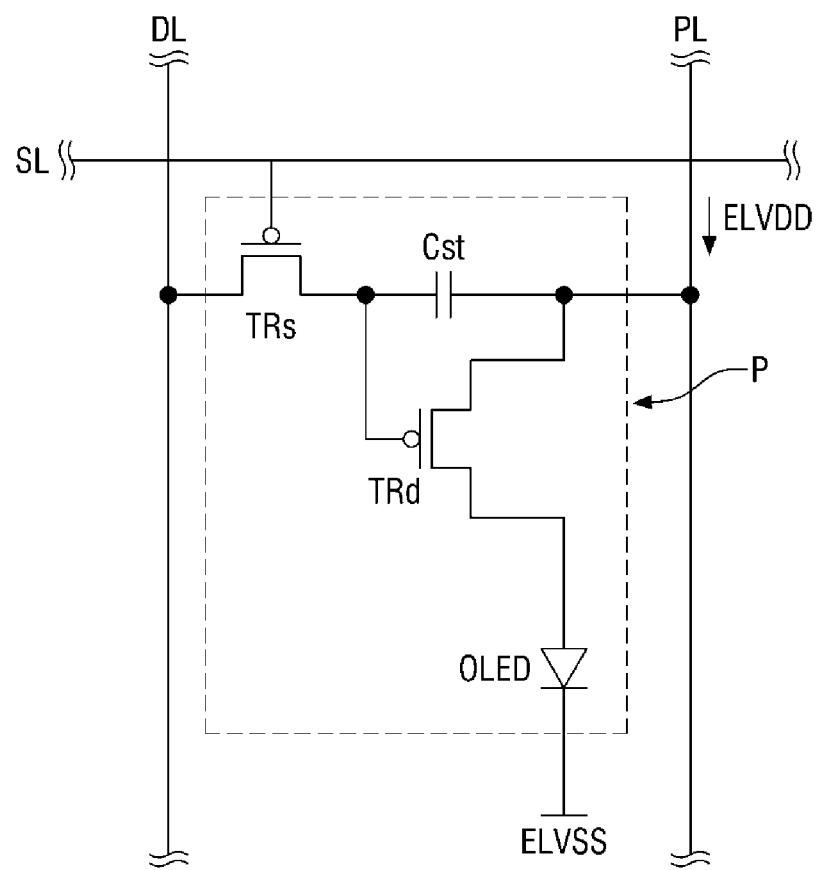
FIG. 4 is a circuit diagram showing a pixel included in the display unit of FIG. 3.

FIG. 4 is a circuit diagram showing a pixel included in the display unit of FIG. 3.

Referring to FIG. 4, the organic light-emitting diode OLED may be a top-emission organic light-emitting diode or a bottom-emission organic light-emitting diode. The pixel PX is a pixel driver circuit for driving the organic light-emitting diode OLED and includes a switching transistor TRs, a driving transistor TRd, and a storage capacitor Cst.

The first supply voltage ELVDD is supplied to the driving transistor TRd, and the second supply voltage ELVSS is supplied to the organic light-emitting diode OLED. The second supply voltage ELVSS may have a voltage level lower than that of the first supply voltage ELVDD.

The switching transistor TRs outputs a data signal applied to the data line DL in response to a scan signal applied to the scan line SL. The storage capacitor Cst is charged with the voltage corresponding to the data signal received from the switching transistor TRs. The driving transistor TRd is connected to the organic light-emitting diode OLED. The driving transistor TRd controls the driving current flowing in the organic light-emitting diode OLED in response to the amount of charges stored in the capacitor Cst.

The equivalent circuit is merely an example, and the pixel P is not limited thereto. For example, the pixel P may further include one or more transistors and may include more capacitors. The organic light-emitting diode OLED may be connected between the power line PL and the driving transistor TRd.

FIG. 5 is a view showing an example of the sensor unit of FIG. 2 according to some example embodiments.

FIG. 5 shows only the sensors SC, the sensor lines TL and RL, and the sensor pads SP for convenience of illustration.

Referring to FIG. 5, the sensor unit SU includes a sensor area SSA for sensing a user's touch, a sensor peripheral area SPA located around the sensor area SSA, and a hole AH. The sensor area SSA overlaps with the display area DA and the gap area GA of the display unit DU, and the sensor peripheral area SPA overlaps the first non-display area NDA1 of the display unit DU. Because the hole AH is formed such that it penetrates through the display unit DU and the sensor unit SU as described above, the hole AH formed in the display unit DU and the hole AH formed in the sensor unit SU may overlap with each other in the third direction (z-axis direction).

The sensors SC may be located in the sensor area SSA. The sensors SC may include the sensing electrodes RE electrically connected with one another in the first direction (x-axis direction), and driving electrodes TE electrically connected with one another in the second direction (y-axis direction) intersecting the first direction (x-axis direction). In addition, although the sensing electrodes RE and the driving electrodes TE are formed in a diamond-like shape when viewed from the top in FIG. 5, the present disclosure is not limited thereto.

The sensors may include first connection electrodes BE1 and second connection electrodes BE2 in order to prevent or reduce instances of a short circuit being created at the intersections between the sensing electrodes RE and the driving electrodes TE. The first connection electrodes BE1 electrically connect between the driving electrodes TE adjacent to each other in the second direction (y-axis direction), and the second connection electrodes BE2 electrically connect between the sensing electrodes RE adjacent to each other in the first direction (x-axis direction). In such case, the driving electrodes TE, the sensing electrodes RE, the second connection electrodes BE2 included in the driving electrodes RE may be located on a single layer. The first connection electrodes BE1 included in the driving electrodes TE may be arranged at a different layer from the driving electrodes TE, the sensing electrodes RE and the second connection electrodes BE2. In addition, the sensing electrodes RE electrically connected with one another in the first direction (x-axis direction), and driving electrodes TE electrically connected with one another in the second direction (y-axis direction) are electrically insulated from one another.

The sensor lines TL and RL may be located in the sensor peripheral area SPA. The sensor lines TL and RL may include sensing lines RL connected to the sensing electrodes RE, and first driving lines TL1 and second driving lines TL2 connected to the driving electrodes TE.

The sensing electrodes RE located on the right side of the sensor area SSA may be connected to the sensing lines RL. For example, some of the sensing electrodes RE electrically connected in the first direction (x-axis direction) that are located at the right end may be connected to the sensing lines RL. The sensing lines RL may be connected to first sensor pads SP1.

The driving electrodes TE located on the lower side of the sensor area SSA may be connected to the first driving lines TL1, while the driving electrodes TE located on the upper side of the sensor area SSA may be connected to the second driving lines TL2. For example, some of the driving electrodes TE electrically connected to one another in the second direction (y-axis direction) on the lowermost side may be connected to the first driving line TL1, while some of the driving electrodes TE located on the uppermost side may be connected to the second driving line TL2. The second driving lines TL2 may be connected to the driving electrodes TE on the upper side of the touch sensor area SSA via the left outer side of the sensor area SSA. The first driving lines TL1 and the second driving lines TL2 may be connected to the second touch pads TP2.

The sensors SC may be self-capacitance sensors or mutual-capacitance sensors. When the sensors SC are mutual-capacitance sensors, the driving signals are supplied to the driving electrodes TE through the first driving lines TL1 and the second driving lines TL2. By doing so, the mutual capacitances formed at the intersections between the sensing electrodes RE and the driving electrodes TE are charged. Then, changes in the amount of the charges of the sensing electrodes RE are measured through the sensing lines RL, and it is determined whether a touch input is made according to the changes in the amount of the charges of the sensing electrodes RE.

When the sensors SC are self-capacitance sensors, the driving signals are supplied to the driving electrodes TE as well as the sensing electrodes RE through the first driving lines TL1, the second driving lines TL2 and the sensing lines RL. By doing so, the self capacitances of the sensing electrodes RE and the driving electrodes TE are charged. Then, changes in the amount of the charges of the self-capacitances of the driving electrodes TE and the sensing electrodes RE are measured through the first driving lines TL1, the second driving lines TL2 and the sensing lines RL, and it is determined whether a touch input is made according to the changes in the amount of the charges of the self-capacitances.

It is also possible to divide the sensor unit SU into sub-areas and position the sensors SC in each of the sub-areas, thereby determining whether or not a crack occurs based on the detected values from the sensors SC. For example, it may be possible to divide the sensor unit SU into one or more sub-areas and compare a reference value for the set sensing area with the detected value, thereby determining whether or not a crack occurs.

Figure 6:
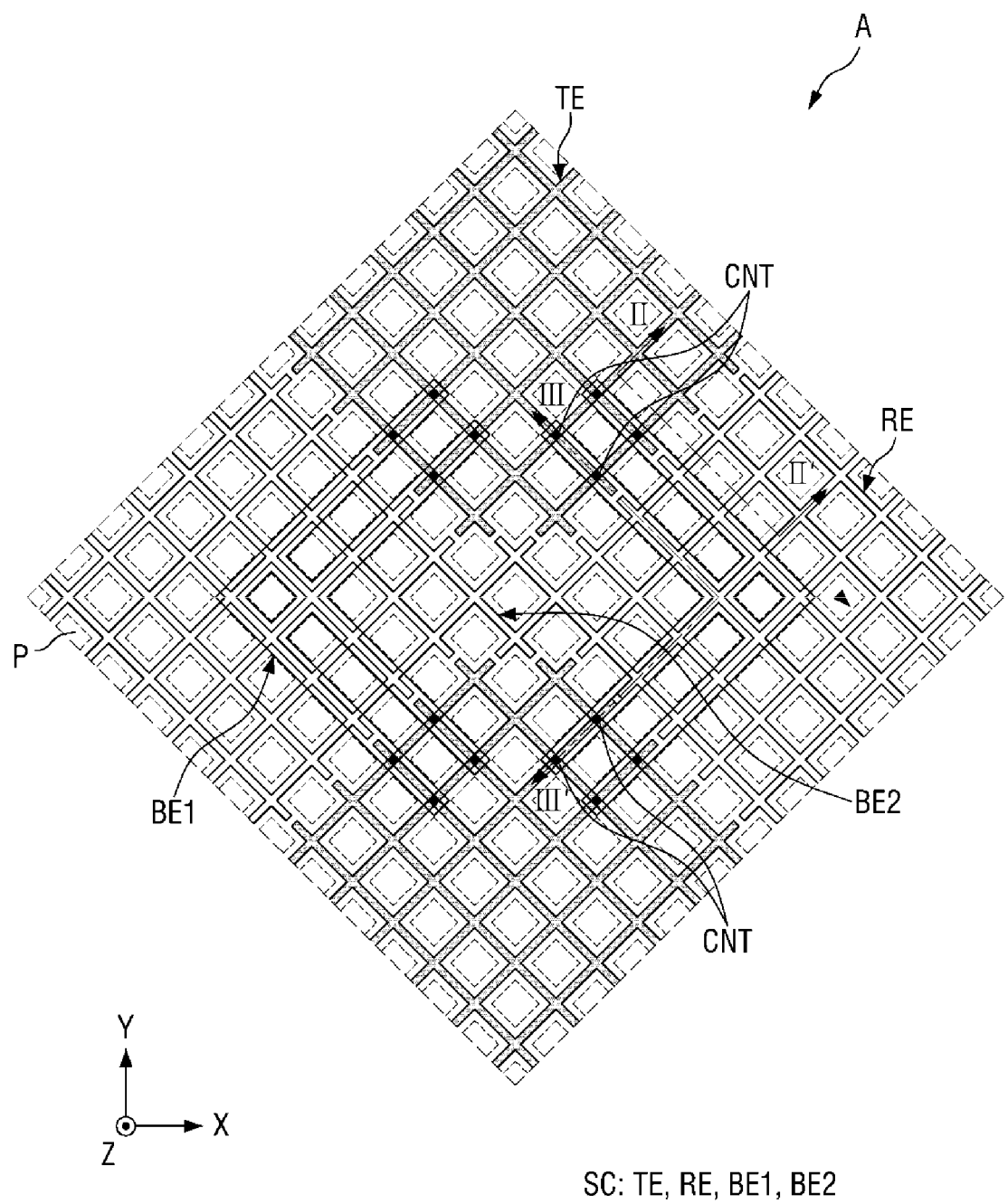
FIG. 6 is an enlarged view of portion A of the display device shown in FIG. 5.

The driving electrodes TE, the sensing electrodes RE and the connection electrodes BE may be formed as mesh-shaped electrodes as shown in FIG. 6. If the sensor unit SU including the driving electrodes TE and the sensing electrodes RE is formed directly on the thin-film encapsulation layer TFEL as shown in FIG. 2, the distance between the second electrode of the light-emitting elements layer EML and the driving electrodes TE or the sensing electrodes RE of the sensor unit SU is close. As a result, a very large parasitic capacitance may be formed between the second electrode of the light-emitting element layer EML and the driving electrodes TE or the sensing electrodes RE of the sensor unit SU. For this reason, in order to reduce the parasitic capacitance, it is desired that the driving electrodes TE and the sensing electrodes RE are formed as the mesh-shaped pattern as shown in FIG. 6, rather than being formed as non-patterned electrodes of a transparent oxide conductive layer such as ITO and IZO.

A first guard line GL1 may be located on the outer side of the outermost one of the sensing lines RL. In addition, a first ground line GRL1 may be located on the outer side of the first guard line GL1. That is to say, the first guard line GL1 may be located on the right side of the rightmost one of the sensing lines, and the first ground line GRL1 may be located on the right side of the first guard line GL1.

A second guard line GL2 may be located between the innermost one of the sensing lines RL and the first driving line TL1 which is the rightmost one of the first driving lines TL1. The second guard line GL2 may be located between the rightmost one of the first driving lines TL1 and the second ground line GRL2. Furthermore, a third guard line GL3 may be located between the innermost one of the sensing lines RL and the second ground line GRL2. The second ground line GRL2 may be connected to a first touch pad located at the leftmost one of the first sensor pads SP1 and a second sensor pad located at the rightmost one of the second sensor pads SP2.

A fourth guard line GL4 may be located on the outer side of the outermost one of the second driving lines TL2. In addition, a third ground line GRL3 may be located on the outer side of the fourth guard line GL4. For example, the fourth guard line GL4 may be located on the left and upper sides of the leftmost and the uppermost one of the second driving lines TL2. The third ground line GRL3 may be located on the left and the upper sides of the fourth guard line GL4.

A fifth guard line GL5 may be located on the inner side of the innermost one of the second driving lines TL2. For example, the fifth guard line GL5 may be located between the rightmost one of the second driving lines TL2 and the sensors SC.

According to some example embodiments of the present disclosure shown in FIG. 5, the first ground line GRL1, the second ground line GRL2 and the third ground line GRL3 are located on the uppermost side, the leftmost side and the rightmost side of the display panel 100, respectively. In addition, a ground voltage is applied to the first ground line GRL1, the second ground line GRL2 and the third ground line GRL3. Accordingly, when static electricity is applied from the outside, the static electricity can be discharged to the first ground line GRL1, the second ground line GRL2, and the third ground line GRL3.

In addition, according to some example embodiments of the present disclosure shown in FIG. 5, the first guard line GL1 is located between the outermost one of the sensing lines RL and the first ground line GRL1, so that it can reduce the influence by a change in the voltage of the first ground line GRL1 on the outermost one of the sensing lines RL. The second guard line GL2 is located between the innermost one of the sensing lines RL and the outermost one of the first driving line TL1. Therefore, the second guard line GL2 can reduce the influence by a change in the voltage on the innermost one of the sensing lines RL and on the outermost one of the first driving lines TL1. The third guard line GL3 is located between the innermost one of the sensing lines RL and the second ground line GRL2, so that it can reduce the influence by a change in the voltage of the second ground line GRL2 on the innermost one of the sensing lines RL. The fourth guard line GL4 is located between the outermost one of the second sensing lines TL2 and the third ground line GRL3, so that it can reduce the influence by a change in the voltage of the third ground line GRL3 on the second driving line TL2. The fifth guard line GL5 is located between the innermost one of the second driving lines TL2 and the sensors SC, so that it can reduce mutual influence between the innermost one of the second driving lines TL2 and the sensors SC.

When the sensors SC are mutual-capacitance sensors, a ground voltage may be applied to the first guard line GL1, the second guard line GL2, the third guard line GL3, the fourth guard line GL4 and the fifth line GL5. When the sensors SC are self-capacitance sensors, the same driving signals as the driving signals applied to the first driving lines TL1, the second driving lines TL2 and the sensing lines RL may be applied to the first guard line GL1, the second guard line GL2, the third guard line GL3, the fourth guard line GL4 and the fifth guard line GL5.

As described above, the hole AH is formed in the sensor unit SU, and the sensors SC are not located in the hole AH. The sensors SC separated by the hole AH are connected with one another by the first connection electrodes BE1 or the second connection electrodes BE2 in the hole AH. For example, the driving electrodes TE separated from one another by the hole AH may be connected with one another by the first connection electrodes BE1 which are extended around the hole AH. The sensing electrodes RE separated from one another by the hole AH may be connected with one another by the second connection electrodes BE2 which are extended around the hole AH.

The circuit board 300 may be electrically connected to the first sensor pads SP1 and the second sensor pads SP2. In some example embodiments, the circuit board 300 may be attached to the first sensor pads SP1 and the second sensor pads SP2 using an anisotropic conductive film. In this manner, the lead lines of the circuit board 300 may be electrically connected to the pads. The circuit board 300 may be a flexible printed circuit board, a printed circuit board, or a flexible film such as a chip on film.

The circuit board 300 may include a touch driver circuit 400, a touch coordinate calculator 500, and a crack detector 600.

The touch driver circuit 400 may be connected to the sensors SC of the sensor unit SU of the display panel 100. The touch driver circuit 400 applies driving signals to the sensors SC of the sensor unit SU and measures capacitances of the touch electrodes. The driving signals may have driving pulses. The touch driver circuit 400 samples changes in the amount of charges of the sensors SC and converts them into touch raw data (TRD) as digital data.

The touch coordinate calculator 500 receives the touch row data TRD from the touch driver circuit 400 and calculates the touch coordinates according to a predetermined touch coordinate calculation method. The touch coordinate calculator 500 may be implemented as a micro controller unit (MCU). It is, however, to be understood that this is merely illustrative. The touch driver circuit 400 and the touch coordinate calculator 500 may be defined as a touch driver.

The crack detector 600 may include a first memory unit for storing reference values for different areas, a second memory for calculating and storing detected values for different areas, a comparing unit for comparing the measured values with the reference values to produce comparison values, and a determining unit for determining whether or not a crack has occurred by determining whether or not the comparison value lies within an error range. The crack detector 600 will be described in more detail later.

Figure 7:
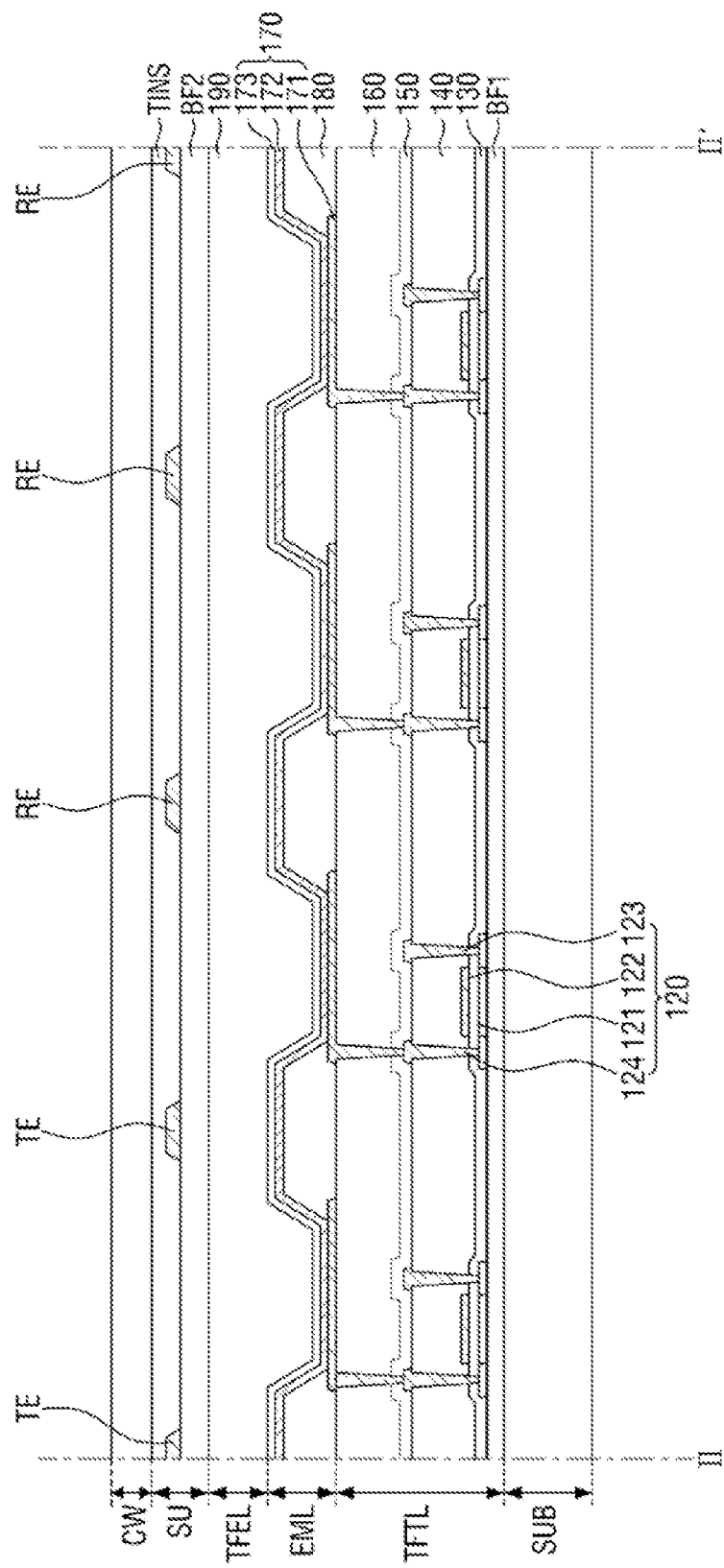
FIG. 7 is a cross-sectional view taken along the line II-II' of FIG. 6.
Figure 8:
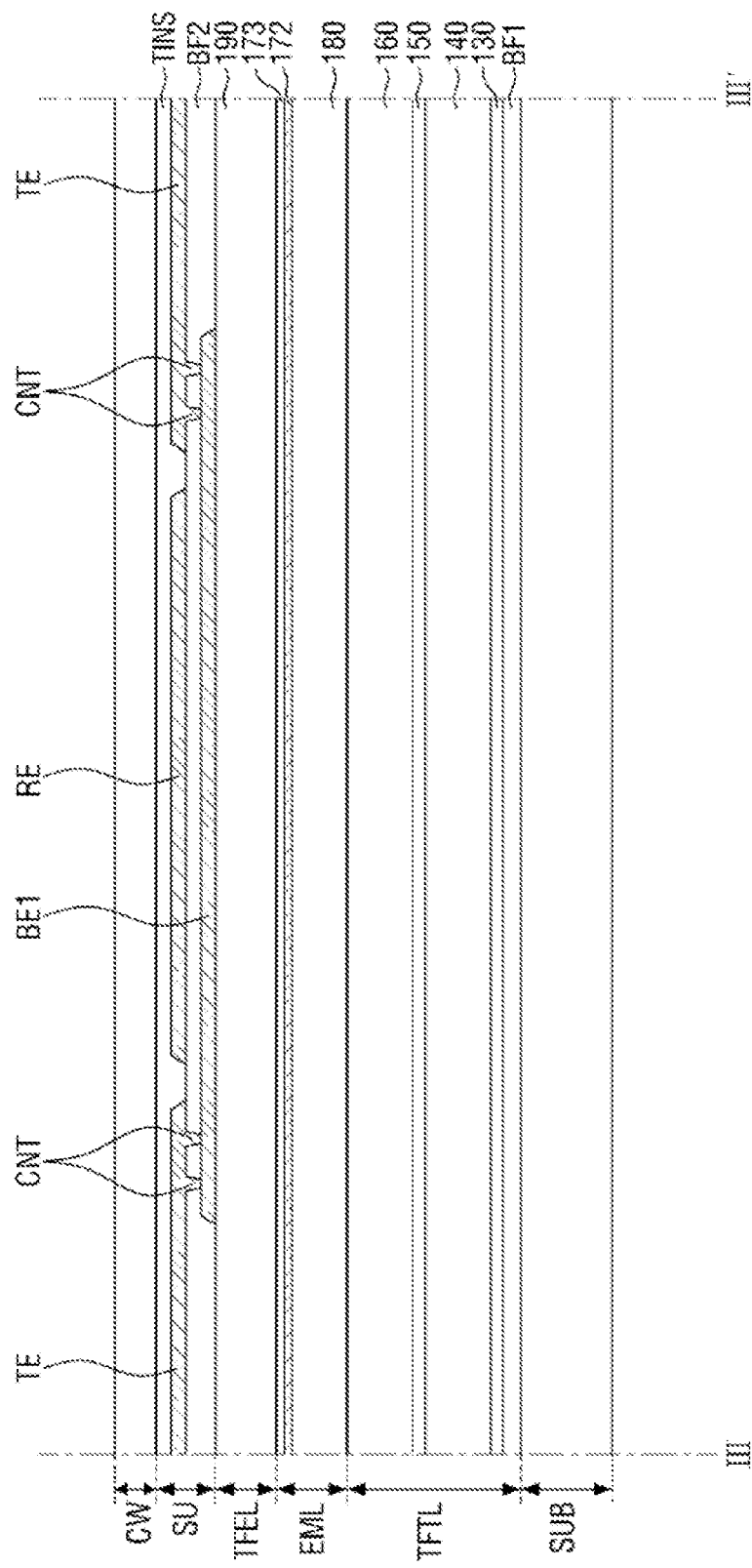
FIG. 8 is a cross-sectional view taken along the line III-III' of FIG. 6.

FIG. 6 is an enlarged view of portion A of the display device shown in FIG. 5. FIG. 7 is a cross-sectional view taken along line II-II' of FIG. 6. FIG. 8 is a cross-sectional view taken along line III-III' of FIG. 6.

Referring to FIG. 6, the sensor unit SU may include the sensors SC, the first connection electrode BE1, and the second connection electrode BE2.

In some example embodiments, each of the driving electrodes TE and the sensing electrodes RE included in the sensor unit SU may be in the form of a mesh surrounding the pixels P. Each of the pixels P may be defined as a region in which light generated in the light-emitting element layer EML of the display unit DU exits to the outside of the display unit DU. In some example embodiments, each of the pixels P may represent different first to third colors, respectively. The first color may be red, the second color may be green, and the third color may be blue. It is, however, to be understood that the present disclosure is not limited thereto. In some example embodiments, the pixels P may represent the same first color or may represent the first color to the four colors, respectively.

Although the pixels P are formed in a diamond shape when viewed from the top in the example shown in FIG. 6, the present disclosure is not limited thereto. That is to say, the pixels P may be formed in a rectangular or square shape when viewed from the top or may be formed in any other polygonal shape, a circular shape, or an elliptic shape other than a quadrangular shape. Further, the shapes of the pixels P may be different from one another.

Although the pixels P have the same size when viewed from the top in the example shown in FIG. 6, the present disclosure is not limited thereto. In some example embodiments, the pixels P may have different sizes when viewed from the top. For example, when viewed from the top, the size of the pixel P producing red light may be larger than the size of the pixel P producing green light, and the size of the pixel P producing blue light may be larger than the size of the pixel P producing the green light. Further, in some example embodiments, the size of the pixel P producing red light may be substantially equal to or smaller than the size of the pixel P producing blue light when viewed from the top.

The first connection electrodes BE1 may be bent at least once in the form of "<" or ">" when viewed from the top. It is, however, to be understood that the form of the first connection electrodes BE1 is not limited thereto. The first connection electrodes BE1 may electrically connect the driving electrodes TE with one another in the second direction (y-axis direction).

Each of the second connection electrodes BE2 may be located between adjacent ones of the sensing electrodes RE and may electrically connect the sensing electrodes RE with one another in the second direction (y-axis direction).

The first connection electrodes BE1 and the second connections electrode BE2 may be arranged on different layers. For example, the driving electrodes TE, the sensing electrodes RE, the second connection electrodes BE2 included in the driving electrodes RE may be arranged on a single layer. The first connection electrodes BE1 included in the driving electrodes TE may be arranged a different layer from the driving electrodes TE, the sensing electrodes RE and the second connection electrodes BE2. In addition, the sensing electrodes RE electrically connected with one another in the first direction (x-axis direction), and driving electrodes TE electrically connected with one another in the second direction (y-axis direction) are electrically insulated from one another. The second connection electrodes BE2 may be connected to the driving electrodes TE through the contact holes CTH where they overlap with the driving electrodes TE.

FIG. 6 is a plan view showing an example of the sub-pixels of FIG. 4 and the first touch metal layer of FIG. 5.

Referring to FIG. 6, the sub-pixels may include first sub-pixels RP, second sub-pixels GP, and third sub-pixels BP. Each of the first sub-pixels RP may represent a first color, each of the second sub-pixels GP may represent a second color, and each of the third sub-pixels BP may represent a third color. The first color may be red, the second color may be green, and the third color may be blue. It is, however, to be understood that the present disclosure is not limited thereto.

In the display panel 100, each of the pixels P may represent a white grayscale. One first sub-pixel RP, two second sub-pixels GP and one third sub-pixel BP may be defined as one pixel P. In addition, the first sub-pixel RP, the second sub-pixels GP and the third sub-pixel BP, which are defined as a single pixel P, may be arranged in a diamond shape as shown in FIG. 6.

The number of the first sub-pixels RP may be equal to the number of the third sub-pixels BP in the display panel 100. The number of the second sub-pixels GP in the display panel 100 may be equal to twice the number of the first sub-pixels RP and twice the number of the third sub-pixels BP. In addition, in the display panel 100, the number of the second sub-pixels GP may be equal to the sum of the number of the first sub-pixels RP and the number of the third sub-pixels BP.

In FIG. 6, the first sub-pixels RP, the second sub-pixels GP and the third sub-pixels BP are formed in a diamond shape when viewed from the top. It is, however, to be understood that the present disclosure is not limited thereto. That is to say, the first sub-pixels RP, the second sub-pixels GP and the third sub-pixels BP may be formed in a rectangular or square shape when viewed from the top or may be formed in any other polygonal shape, a circular shape, or an elliptic shape other than a quadrangular shape. In addition, the first sub-pixels RP, the second sub-pixels GP and the third sub-pixels BP may have different shapes.

In FIG. 6, the first sub-pixels RP, the second sub-pixels GP and the third sub-pixels BP have the same size when viewed from the top. It is, however, to be understood that the present disclosure is not limited thereto. That is to say, the first sub-pixels RP, the second sub-pixels GP and the third sub-pixels BP may have different sizes when viewed from the top. For example, when viewed from the top, the size of the first sub-pixels RP may be larger than the size of the second sub-pixels GP, and the size of the third sub-pixels BP may be larger than the size of the second sub-pixels GP. In addition, when viewed from the top, the size of the first sub-pixels RP may be substantially equal to or smaller than the size of the third sub-pixels BP.

The driving electrodes TE may be formed in a mesh shape and located between the sub pixels RP, GP and BP. By doing so, may be possible to prevent or reduce instances of the opening area of each of the sub-pixels RP, GP and BP being reduced by the driving electrodes TE. In addition, because the overlapping area between the driving electrode TE and the second electrode 173 can be reduced, the parasitic capacitance between the driving electrodes TE and the second electrode 173 can be reduced. The sensing electrodes RE may be formed to be substantially the same as the driving electrodes TE; and, therefore, some redundant description of the sensing electrode RE will be omitted.

Referring to FIGS. 7 and 8, the thin-film transistor layer TFTL is formed on the substrate SUB. The thin-film transistor layer TFTL includes a first buffer film BF1, thin-film transistors 120, a gate insulating layer 130, an interlayer dielectric layer 140, a protective layer 150, and a planarization layer 160.

The first buffer film BF1 may be formed on one surface of the substrate SUB. The first buffer film BF1 may be formed on one surface of the substrate SUB in order to protect the thin-film transistors 120 and organic emitting layer 172 of the light-emitting element layer EML from moisture that is likely to permeate through the substrate SUB. The first buffer film BF1 may be made up of multiple inorganic layers sequentially stacked on one another. For example, the first buffer film BF1 may be made up of multiple layers in which one or more inorganic layers of a silicon nitride layer, a silicon oxynitride layer, a silicon oxide layer, a titanium oxide layer and an aluminum oxide layer are alternately stacked on one another. The first buffer film BF1 may be eliminated.

Figure 9:
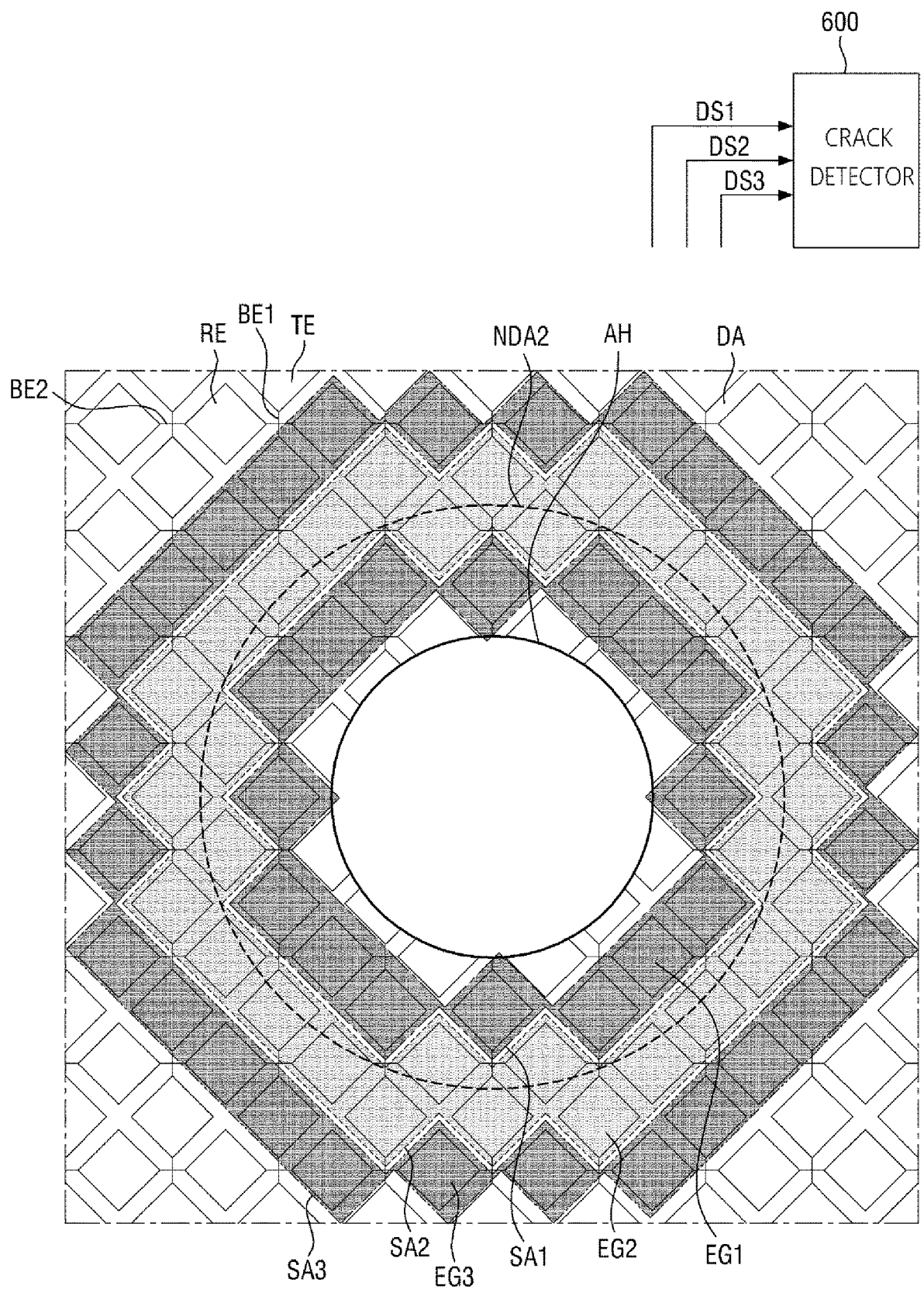
FIG. 9 is a view schematically showing a region in which a hole is formed and a crack detector according to some example embodiments of the present disclosure.

The thin-film transistors 120 are formed on the first buffer film BF1. Each of the thin-film transistor 120 includes an activate layer 121, a gate electrode 122, a source electrode 123, and a drain electrode 124. In FIG. 9, the thin-film transistors 120 are implemented as top-gate transistors in which the gate electrode 122 is located above the active layer 121. It is, however, to be understood that the present disclosure is not limited thereto. That is to say, the thin-film transistors 120 may be implemented as bottom-gate transistors in which the gate electrode 122 is located below the active layer 121, or as double-gate transistors in which the gate electrodes 122 are located above and below the active layer 121.

The active layer 121 is formed on the first buffer film BF1. The active layer 121 may include polycrystalline silicon, single crystal silicon, low-temperature polycrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. For example, the active layer 121 may include an oxide including indium, tin and titanium (ITZO) or an oxide including indium, gallium and tin (IGZO). A light-blocking layer for blocking external light incident on the active layer 121 may be formed between the buffer layer and the active layer 121.

The gate insulating layer 130 may be formed on the active layer 121. The gate insulating layer 130 may be formed of an inorganic layer, for example, a silicon nitride layer, a silicon oxynitride layer, a silicon oxide layer, a titanium oxide layer, or an aluminum oxide layer.

The gate electrodes 122 and gate lines may be formed on the gate insulating layer 130. The gate electrodes 122 and the gate lines may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The interlayer dielectric layer 140 may be formed over the gate electrodes 122 and the gate lines. The interlayer dielectric layer 140 may be formed of an inorganic layer, for example, a silicon nitride layer, a silicon oxynitride layer, a silicon oxide layer, a titanium oxide layer, or an aluminum oxide layer.

The source electrodes 123 and the drain electrodes 124 may be formed on the interlayer dielectric layer 140. Each of the source electrodes 123 and the drain electrodes 124 may be connected to the active layer 121 through a contact hole penetrating through the gate insulating layer 130 and the interlayer dielectric layer 140. The source electrode 123 and the drain electrode may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The protective layer 150 may be formed on the source electrode 113 and the drain electrode 124 in order to insulate the thin-film transistors 120. The protective layer 150 may be formed of an inorganic layer, for example, a silicon nitride layer, a silicon oxynitride layer, a silicon oxide layer, a titanium oxide layer, or an aluminum oxide layer.

The planarization layer 160 may be formed on the protective layer 150 to provide a flat surface over the step differences of the thin-film transistors 120. The planarization layer 160 may be formed of an organic layer such as an acryl resin, an epoxy resin, a phenolic resin, a polyamide resin and a polyimide resin.

The light-emitting element layer EML is formed on the thin-film transistor layer TFTL. The light-emitting element layer EML includes light-emitting elements 170 and a pixel-defining layer 180.

The light-emitting elements 170 and the pixel-defining layer 180 are formed on the planarization layer 160. Each of the light-emitting elements 170 may include a first electrode 171, an organic emitting layer 172, and a second electrode 173.

The first electrode 171 may be formed on the planarization layer 160. The first electrode 171 is connected to the source electrode 123 of the thin-film transistor 120 through the contact hole penetrating through the protective layer 150 and the planarization layer 160.

In the top-emission organic light-emitting diode that light exits from the organic emitting layer 172 toward the second electrode 173, the first electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd), and copper (Cu).

In the bottom-emission organic light-emitting diode that light exits from the organic emitting layer 172 toward the first electrode 171, the first electrode 171 may be formed of a transparent conductive material (TCP) such as ITO and IZO that can transmit light, or a semi-transmissive conductive material such as magnesium (Mg), silver (Ag) and an alloy of magnesium (Mg) and silver (Ag). In such case, when the first electrode 171 is made of a semi-transmissive metal material, the light extraction efficiency can be increased by using microcavities.

The pixel-defining layer 180 may be formed to separate the first electrode 171 from one another on the planarization layer 160 in order to define each of the pixels P. The pixel-defining layer 180 may be formed to cover the edge of the first electrode 171. The pixel-defining layer 180 may be formed of an organic layer such as an acryl resin, an epoxy resin, a phenolic resin, a polyamide resin and a polyimide resin.

In each of the pixels P, the first electrode 171, the organic emitting layer 172 and the second electrode 173 so that holes from the first electrode 171 and electrons from the second electrode 173 are combined with each other in the organic emitting layer 172 to emit light. Each of the pixels P may include the light-emitting element 170.

The organic emitting layer 172 is formed on the first electrode 171 and the pixel-defining layer 180. The organic emitting layer 172 may include an organic material and emit light of a certain color. For example, the organic emitting layer 172 may include a hole transporting layer, an organic material layer, and an electron transporting layer.

The second electrode 173 is formed on the organic emitting layer 172. The second electrode 173 may be formed to cover the organic emitting layer 172. The second electrode 173 may be a common layer formed across the pixels P. A capping layer may be formed on the second electrode 173.

In the top-emission organic light-emitting diode, the second electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). When the second electrode 173 is formed of a transflective metal material, the light extraction efficiency can be increased by using microcavities.

In the bottom-emission organic light-emitting diode, the second electrode 173 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd), and copper (Cu).

The thin-film encapsulation layer TFFL is formed on the light-emitting element layer EML. The thin-film encapsulation layer TFEL includes an encapsulation layer 190.

The encapsulation layer 190 is arranged on the second electrode 173. The encapsulation layer 190 may include at least one inorganic layer to prevent or reduce instances of oxygen or moisture permeating into the organic emitting layer 172 and the second electrode 173. In addition, the encapsulation layer 190 may include at least one organic layer to protect the light-emitting element layer EML from foreign substances such as dust. For example, the encapsulation layer 190 may include a first inorganic layer located on the second electrode 173, an organic layer located on the first inorganic layer, and a second inorganic layer located on the organic layer. The first inorganic layer and the second inorganic layer may be formed of, but is not limited to, a silicon nitride layer, a silicon oxynitride layer, a silicon oxide layer, a titanium oxide layer, or an aluminum oxide layer. The organic layer may be formed of, but is not limited to, an acryl resin, an epoxy resin, a phenolic resin, a polyamide resin and a polyimide resin.

The sensor unit SU is located on the thin-film encapsulation layer TFEL. The sensor unit SU includes a second buffer film BF2, a sensor insulating layer TINS located on the second buffer film BF2, the sensors SC located between the second buffer film BF2 and the sensor insulating layer TINS.

The first connection electrode BE1 and the second buffer film BF2 may be located on the thin-film encapsulation layer TFEL. For example, the first connection electrode BE1 may be located on the thin-film encapsulation layer TFEL, and the second buffer film BF2 may be located to cover the thin-film encapsulation layer TFEL and the first connection electrode BE1. Contact holes CNT may be formed in the second buffer film BF2 via which a part of the first connection electrode BE1 is exposed.

The second buffer film BF2 may be made up of multiple inorganic layers sequentially stacked on one another. For example, the second buffer film BF2 may be made up of multiple layers in which one or more inorganic layers of a silicon nitride layer, a silicon oxynitride layer, a silicon oxide layer, a titanium oxide layer and an aluminum oxide layer are alternately stacked on one another. The second buffer film BF2 may be eliminated.

The driving electrodes TE and the sensing electrodes RE may be located on the second buffer film BF2. The second connection electrode BE2, the first driving lines TL1, the second driving lines TL2, the sensing lines RL, guard lines GL1, GL2, GL3, GL4 and GL5 and ground lines GRL1, GRL2 and GRL3 may be located on the second buffer film BF2 in addition to the driving electrodes TE and the sensing electrodes RE. That is to say, the driving electrodes TE, the sensing electrodes RE, the second connection electrodes BE2, the first driving lines TL1, the second driving lines TL2, the sensing lines RL, the guard lines GL1, GL2, GL3, GL4 and GL5 and the ground lines GRL1, GRL2 and GRL3 may be located on the same layer and may be made of the same material, except the first connection electrodes BE1. The driving electrodes TE, the sensing electrodes RE, the second connection electrodes BE2, the first driving lines TL1, the second driving lines TL2, the sensing lines RL, the guard lines GL1, GL2, GL3, GL4 and GL5 and the ground lines GRL1, GRL2 and GRL3 may be made of, but is not limited to, a stack structure of aluminum and titanium (Ti/Al/Ti), a stack structure of aluminum and ITO (ITO/Al/ITO), an APC alloy and a stack structure of APC alloy and ITO (ITO/APC/ITO).

The driving electrode TE may be electrically connected to the first connection electrode BE1 through the contact holes CNT formed in the second buffer film BF2 and may be electrically connected with the next driving electrode in the second direction (y-axis direction) by the first connection electrode BE1.

According to some example embodiments, the second connection electrode BE2 may be located on the second buffer film BF2, so that the sensing electrode RE may be electrically connected with the next sensing electrode in the first direction (x-axis direction) by the second connection electrode BE2.

Each of the first connection electrodes BE1 and the second connection electrode BE2 may be made of, but is not limited to, a stack structure of aluminum and titanium (Ti/Al/Ti), a stack structure of aluminum and ITO (ITO/Al/ITO), an APC alloy and a stack structure of APC alloy and ITO (ITO/APC/ITO).

The sensor insulating layer TINS is formed on the driving electrodes TE, the sensing electrodes RE and the second connection electrode BE2. The sensor insulating layer TINS may be formed of an inorganic layer, for example, a silicon nitride layer, a silicon oxynitride layer, a silicon oxide layer, a titanium oxide layer, or an aluminum oxide layer.

Although the first connection electrodes BE are located on the encapsulation layer 190 and the driving electrodes TE and the sensing electrodes RE are located on the second buffer film BF2 in the example shown in FIG. 8, the present disclosure is not limited thereto. In some example embodiments, the driving electrodes TE and the sensing electrodes RE may be located on the encapsulation layer 190 and the first connection electrodes BE may be formed on the second buffer film BF2.

The cover window CW is located on the sensor unit SU. For example, the cover window CW may be located on the sensor insulating layer TINS. The cover window CW has been described in more detail with reference to FIG. 3; and, therefore, some redundant description will be omitted.

Figure 10:
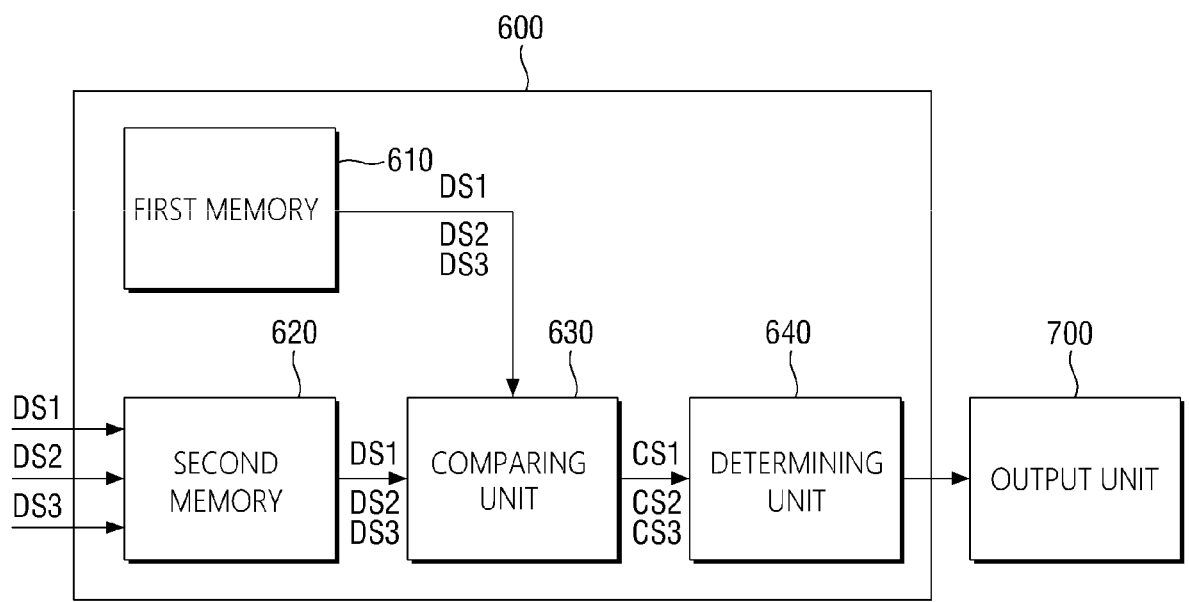
FIG. 10 is a block diagram of a crack detector of a sensor unit according to some example embodiments of the present disclosure.

FIG. 9 is a view schematically showing a region in which a hole is formed and a crack detector according to some example embodiments of the present disclosure. FIG. 10 is a block diagram of a crack detector of a sensor unit according to some example embodiments of the present disclosure.

Referring to FIG. 9, the sensor unit SU may include a hole AH and sensors SC located around the hole AH.

The sensor unit SU may include sensing areas. For example, the sensor unit SU may include a first sensing area SA1 in the form of a closed curve located in the second non-display area NDA2 and surrounding the hole AH, a third sensing area SA3 located in the display area DA and surrounding the hole AH, and a second sensing area SA2 located between the first sensing area SA1 and the third sensing area SA3 in the form of a closed curve surrounding the hole AH. The first sensing area SA1, the second sensing area SA2 and the third sensing area SA3 may be contiguous to and connected with one another as shown in FIG. 9. It is, however, to be understood that the present disclosure is not limited thereto. In some implementations, the first sensing area SA1, the second sensing area SA2 and the third sensing area SA3 may be spaced apart from each other by a predetermined distance.

The sensors SC located in each of the first sensing area SA1, the second sensing area SA2 and the third sensing area SA3 may be defined as a single group. For example, the sensors SC located in the first sensing area SA1 may be defined as a first sensor group EG1, the sensors SC located in the second sensing area SA2 may be defined as a second sensor group EG2, and the sensors SC located in the third sensing area SA3 may be defined as a third sensor group EG3. Although the plurality of sensors SC is located in each of the sensor groups in the example shown in FIG. 9, this is merely illustrative. A single sensor group may include a single sensor SC depending on the position and size of the sensing areas.

The crack detector 600 can obtain the detected values DS1, DS2 and DS3 from the first sensing area SA1, the second sensing area SA2, and the third sensing area SA3, respectively. Although the single crack detector 600 is shown in FIG. 9, more than one crack detectors 600 may be located so that the number of the crack detectors 600 is equal to the number of the sensing areas. As used herein, the detected value refers to a value for electrical coupling that may be formed between the driving electrode TE, the sensing electrode RE, the first connection electrode BE1 and the second connection electrode BE, which form the sensors SC. The present disclosure is not limited by the kind and characteristics of the detected value. For example, the detected value may be a capacitance that is obtained at the intersection between the first connection electrode BE1 and the second connection electrode BE2. In some example embodiments, the detected value may be a resistance that is obtained at the intersection between the first connection electrode BE1 and the second connection electrode BE2. In the following description, the detected values from the sensing areas are capacitances obtained at the intersections between the first connection electrode BE1 and the second connection electrode BE2 as an example.

The crack detector 600 may detect a first detected value DS1 from the first sensor group EG1 in the first sensing area SA1. The crack detector 600 may detect a second detected value DS2 from the second sensor group EG2 in the second sensing area SA2. The crack detector 600 may detect a third detected value DS3 from the third sensor group EG3 in the third sensing area SA3.

For example, referring to FIG. 10, the crack detector 600 may include a first memory 610, a second memory 620, a comparing unit 630, and a determining unit 640.

The first memory 610 may store a database on reference values RS1, RS2 and RS3 of the sensing areas SA1, SA2 and SA3. For example, in the first memory 610, a database on the first reference value RS1 for the first sensing area SA1, the second reference value RS2 for the second sensing area SA2 and the third reference value RS2 for the third sensing area SA3 may be stored. The reference values RS1, RS2 and RS3 may be defined as capacitances obtained at the intersections between the first connection electrodes BE1 and the second connection electrodes BE2 when there is no crack. For example, the first reference value RS1 may be a capacitance for the first sensor group EG1 in the first sensing area SA1 when there is no crack. The second reference value RS2 may be a capacitance for the second sensor group EG2 in the second sensing area SA2 when there is no crack. The third reference value RS3 may be a capacitance for the third sensor group EG3 in the third sensing area SA3 when there is no crack. The first memory 610 may transfer the reference values RS1, RS2 and RS3 of the sensing areas SA1, SA2 and SA3 to the comparing unit 630. The reference values RS1, RS2 and RS3 of the sensing areas SA1, SA2 and SA3 may be different from one another. It is, however, to be understood that the present disclosure is not limited thereto. The reference values RS1, RS2 and RS3 of the sensing areas SA1, SA2 and SA3 may be equal to one another.

In the second memory 620, the detected values DS1, DS2 and DS3 sensed in the sensing areas SA1, SA2, and SA3, respectively, may be stored. For example, in the second memory 620, a database on the first detected value DS1 for the first sensing area SA1, the second detected value DS2 for the second sensing area SA2 and the third detected value DS3 for the third sensing area SA3 may be stored. The second memory 620 may transfer the detected values DS1, DS2 and DS3 detected in the sensing areas SA1, SA2 and SA3, respectively, to the comparing unit 630.

The first memory 610 and the second memory 620 may include, but is not limited to, volatile memory devices such as a dynamic random access memory (DRAM) and a static random access memory (SRAM), and a non-volatile memory devices such as an erasable programmable read-only memory (EPROM), an electrically erasable programmable read-only memory (EEPROM) and a flash memory device.

The comparing unit 630 may receive the reference values RS1, RS2 and RS3 from the first memory 610 and the detected values DS1, DS, and DS3 from the second memory 620. For example, the comparing unit 630 may receive the first reference value RS1, the second reference value RS2 and the third reference value RS3 from the first memory 610, and the first detected value DS1, the second detected value DS2 and the third detected value DS3 from the second memory 620.

The comparing unit 630 may calculate comparison values CS1, CS2 and CS3 using the received reference values RS1, RS2 and RS3 and detected values DS1, DS2 and DS3. For example, the comparing unit 630 may calculate the first comparison value CS1 by comparing the first reference value RS1 with the first detected value DS1. The comparing unit 630 may calculate the second comparison value CS2 by comparing the second reference value RS2 with the second detected value DS2. The comparing unit 630 may calculate the third comparison value CS3 by comparing the third reference value RS3 with the third detected value DS3. The comparison values CS1, CS2 and CS3 may be represented as absolute values. The comparing unit 630 may transfer the calculated comparison values CS1, CS2 and CS3 to the determining unit 640.

The determining unit 640 receives the comparison values CS1, CS2 and CS3 from the comparing unit 630. For example, the determining unit 640 receives the first comparison value CS1, the second comparison value CS2 and the third comparison value CS3 from the comparing unit 630. The determining unit 640 may store predetermined error ranges.

The different sensing areas SA1, SA2 and SA3 may have different error ranges. For example, a first error range for the first sensing area SA1, a second error range for the second sensing area SA2 and a third error range for the third sensing area SA3 may be stored. The first to third error ranges may be different from one another. It is, however, to be understood that this is merely illustrative. The first to third error ranges may be the same.

It is possible to determine whether or not there is a defect due to a crack by comparing the error ranges (e.g., the predetermined error ranges) with the comparison values CS1, CS2 and CS3, and to transfer the results to an output unit 700. For example, if any of the first comparison value CS1, the second comparison value CS2 and the third comparison value CS3 exceeds the error ranges, a first crack signal is transmitted to the output unit 700. 1111 If the values lie within the error ranges, a second crack signal is transmitted to the output unit 700. In addition, the determining unit 640 may further include a memory for storing the error ranges and an operating unit for determining whether or not the comparison values are within the error ranges.

The determining unit 640 determines that the first sensing area SA1 is defective due to a crack if the first comparison value CS1 exceeds the predetermined error range. The determining unit 640 determines that the second sensing area SA2 is not defective due to a crack if the second comparison value CS1 lies within the predetermined error range. The determining unit 640 determines that the third sensing area SA3 is not defective due to a crack if the third comparison value CS3 lies within the predetermined error range. In such case, it may be determined that a crack has occurred in the first sensing area SA1.

The determining unit 640 determines that the first sensing area SA1 is defective due to a crack if the first comparison value CS1 exceeds the predetermined error range. The determining unit 640 determines that the second sensing area SA2 is defective due to a crack if the second comparison value CS2 exceeds the predetermined error range. The determining unit 640 determines that the third sensing area SA3 is not defective due to a crack if the third comparison value CS3 lies within the predetermined error range. In such case, it may be determined that a crack has occurred from the first sensing area SA1 to the second sensing area SA2.

The determining unit 640 determines that the first sensing area SA1 is defective due to a crack if the first comparison value CS1 exceeds the predetermined error range. The determining unit 640 determines that the second sensing area SA2 is defective due to a crack if the second comparison value CS2 exceeds the predetermined error range. The determining unit 640 determines that the third sensing area SA3 is defective due to a crack if the third comparison value CS3 exceeds the predetermined error range. In such case, it may be determined that a crack has occurred from the first sensing area SA1 to the second sensing area SA2 and from the second sensing area SA2 to the third sensing area SA3.

As described above, the first sensing area SA1, the second sensing area SA2 and the third sensing area SA3 are formed in the region around the hole AH where a crack is likely to occur, and the detected values DS1, DS2 and DS3 obtained from the first sensing area SA1, the second sensing area SA2 and the third sensing area SA3, respectively, are compared with the reference values RS1, RS2 and RS3, respectively, to calculate the comparison values CS1, CS2 and CS3. By doing so, it is possible to determine whether or not a crack occurs in each of the sensing areas SA1, SA2 and SA3 based on the predetermined error ranges.

In the example shown in FIGS. 9 and 10, the first detected value DS1, the second detected value DS2 and the third detected value DS3 are compared with the first reference value RS1, the second reference value RS2 and the third reference value RS3, respectively, to produce the first comparison value CS1, the second comparison value CS2 and the third comparison value CS3. It is, however, to be understood that the present disclosure is not limited thereto. The comparison values may be produced by summing at least two of the first detected value DS1, the second detected value DS2 and the third detected value DS3 and setting a reference value corresponding thereto.

Figure 11:
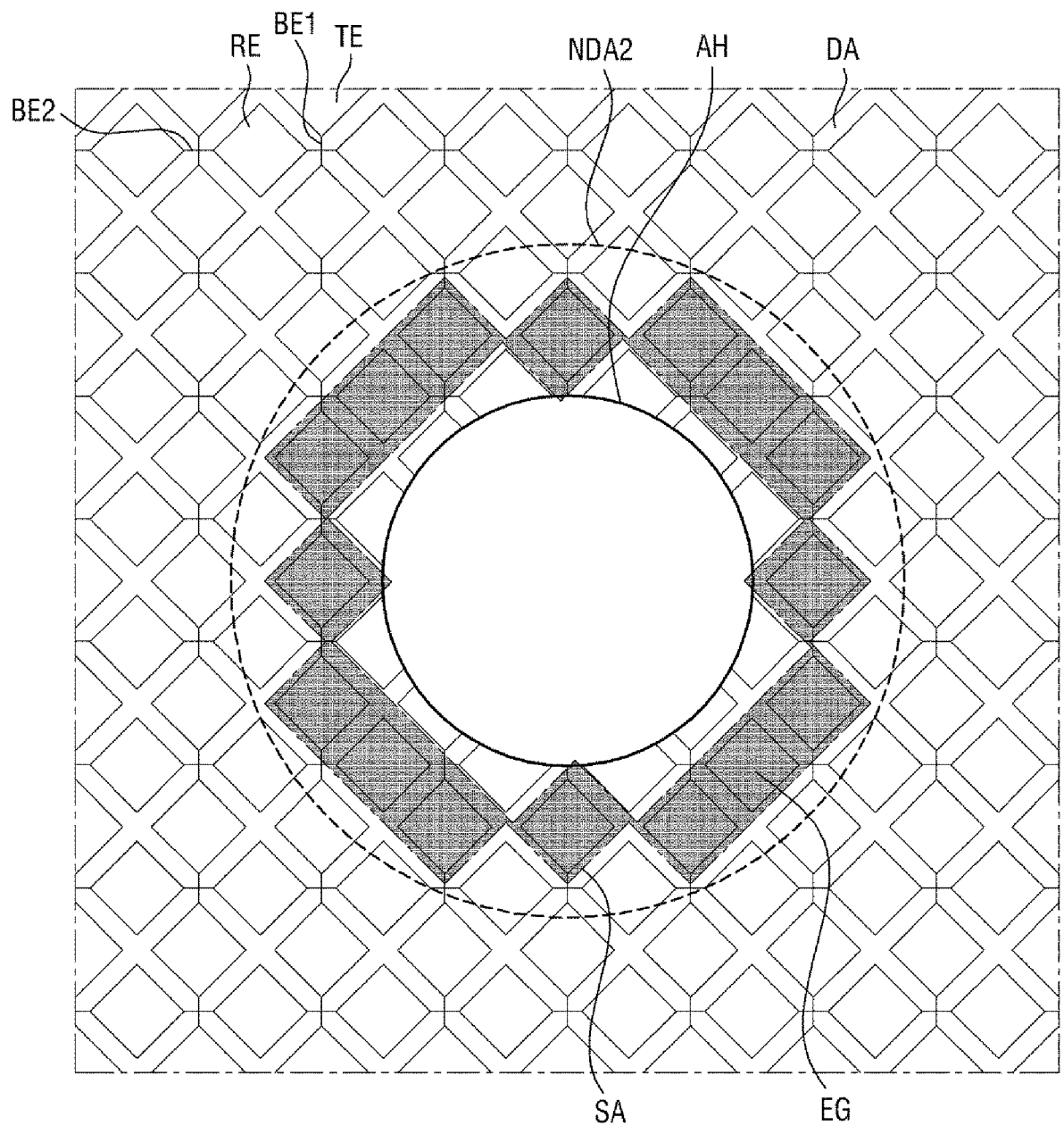
FIG. 11 is a view schematically showing a region in which a hole is formed and a crack detector according to some example embodiments of the present disclosure.
Figure 12:
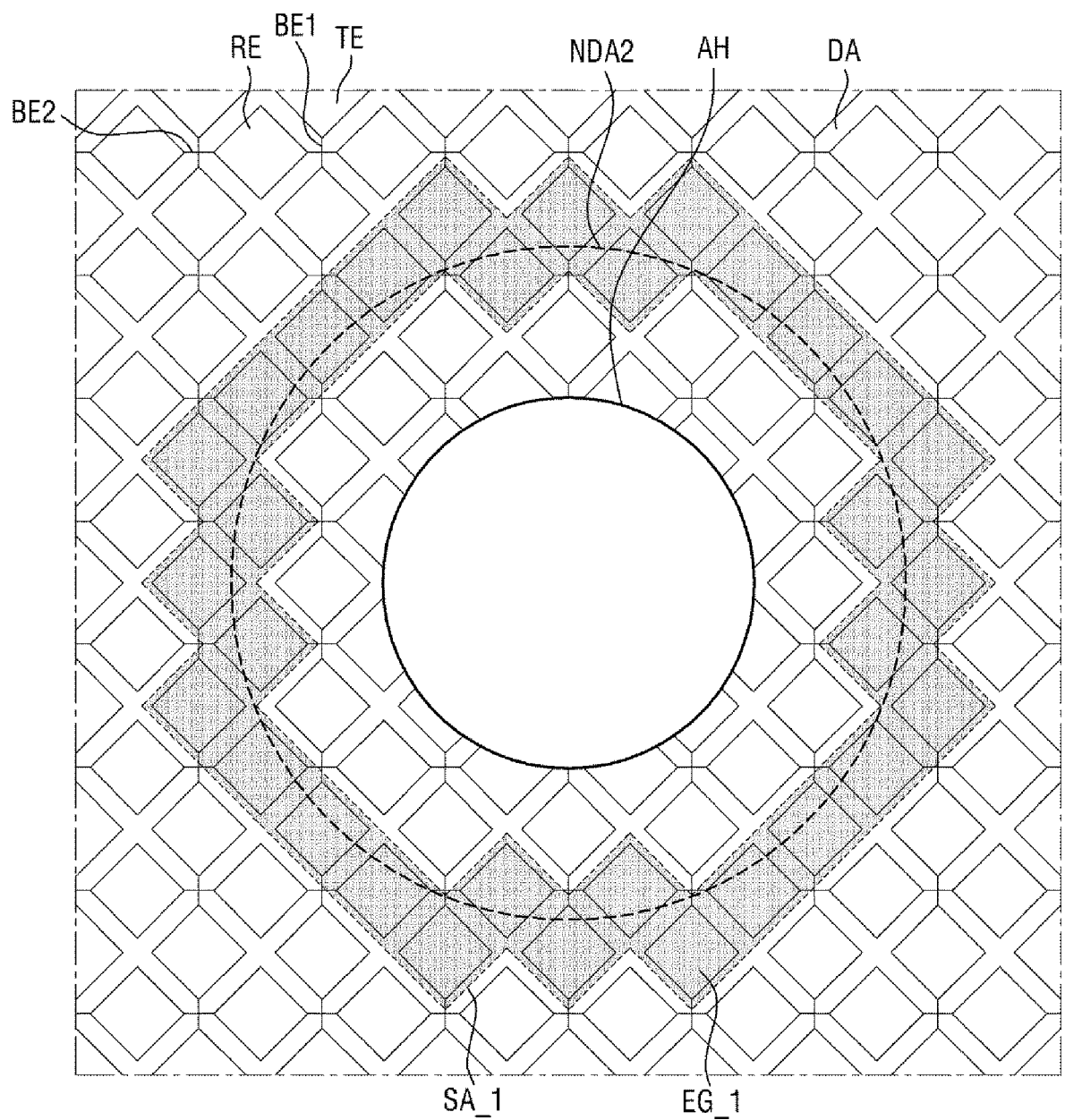
FIG. 12 is a view schematically showing a region in which a holes is formed and a crack detector in a sensor unit according to some example embodiments of the present disclosure.
Figure 13:
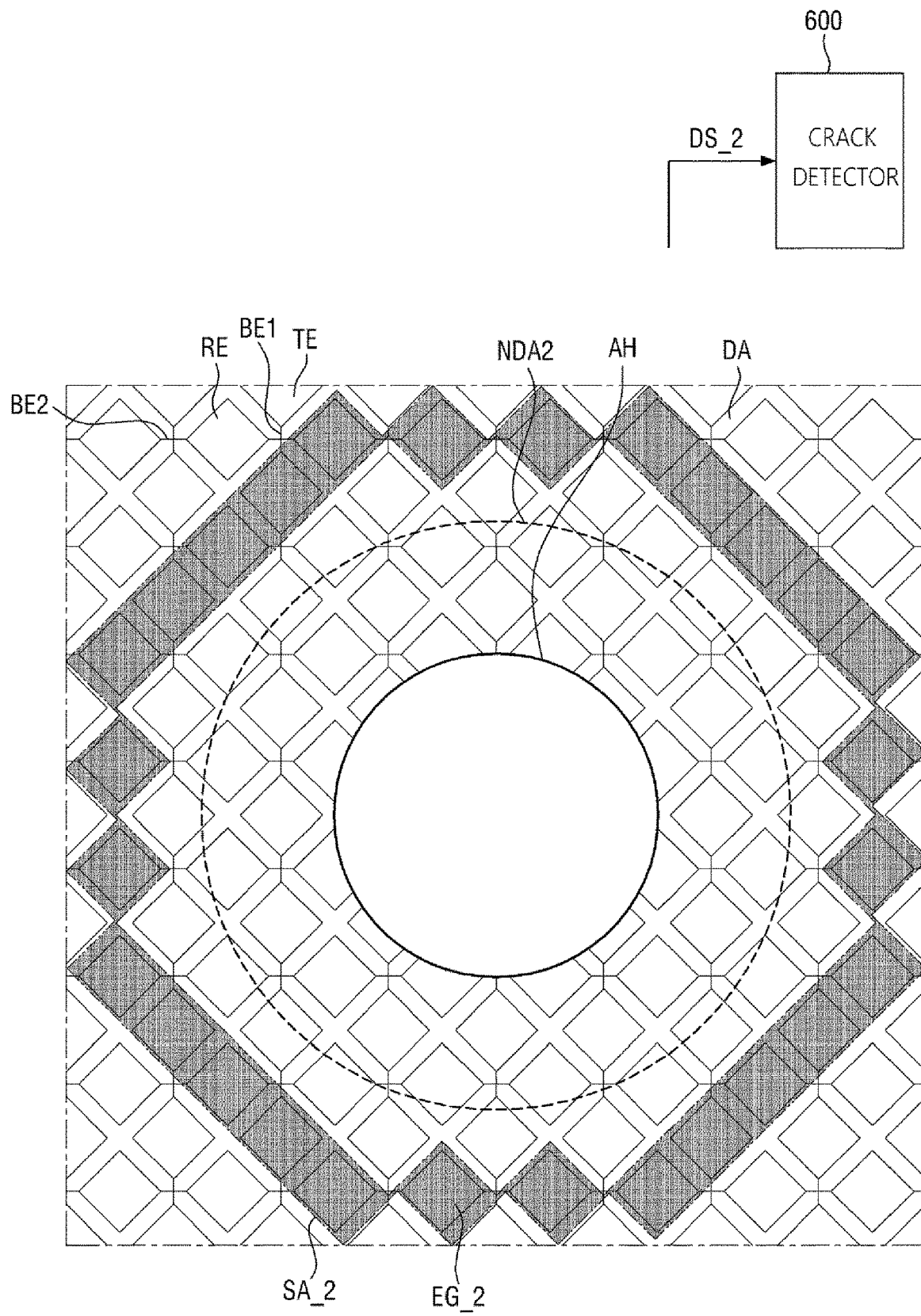
FIG. 13 is a view schematically showing a region in which a holes is formed and a crack detector in a sensor unit according to some example embodiments of the present disclosure.
Figure 14:
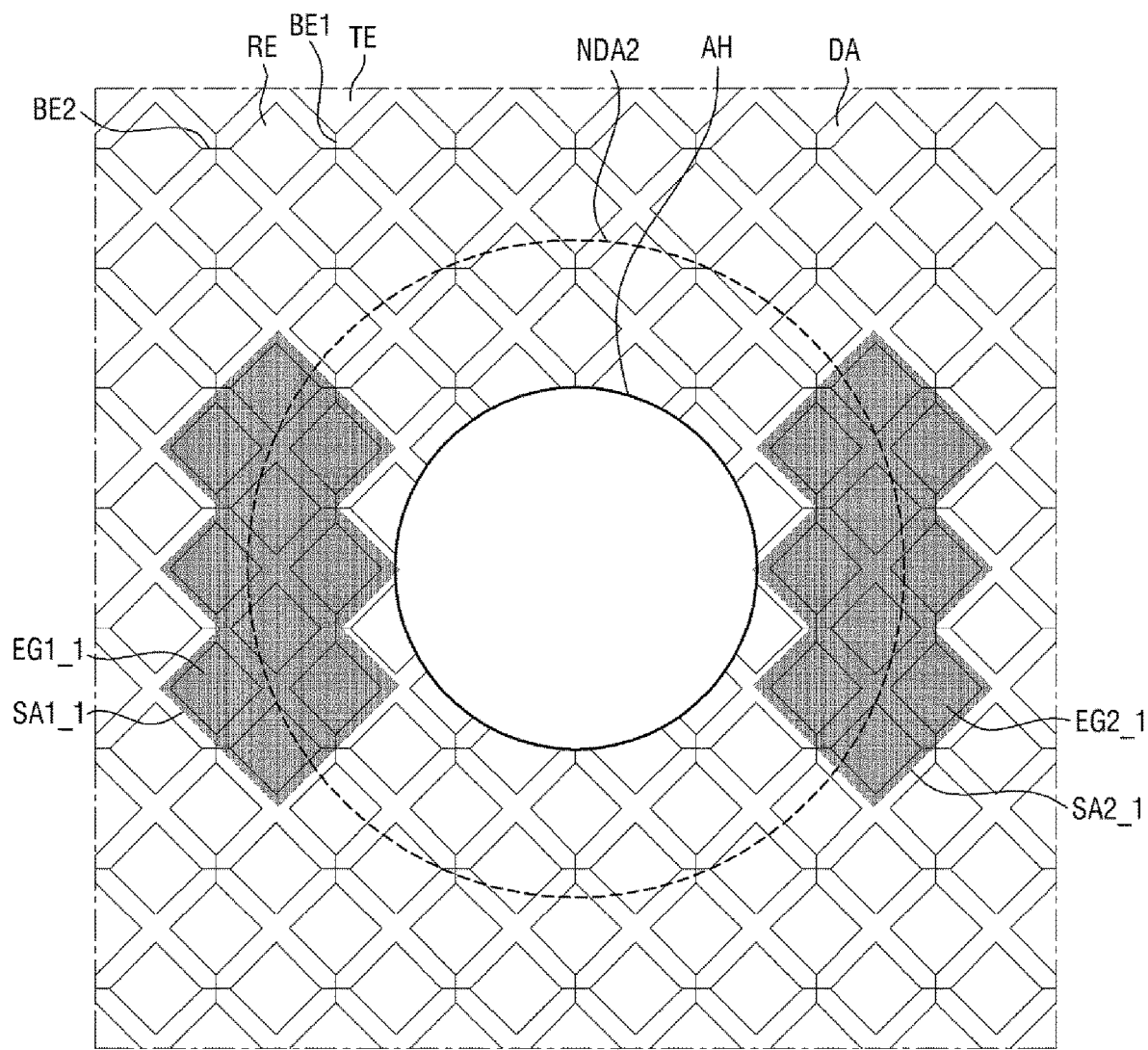
FIG. 14 is a view schematically showing a region in which a holes is formed and a crack detector in a sensor unit according to some example embodiments of the present disclosure.

FIG. 11 is a view schematically showing a region in which a hole is formed and a crack detector according to some example embodiments of the present disclosure. FIG. 12 is a view schematically showing a region in which a holes is formed and a crack detector in a sensor unit according to some example embodiments of the present disclosure. FIG. 13 is a view schematically showing a region in which a holes is formed and a crack detector in a sensor unit according to some example embodiments of the present disclosure. FIG. 14 is a view schematically showing a region in which a holes is formed and a crack detector in a sensor unit according to some example embodiments of the present disclosure. FIGS. 11 to 14 are views for illustrating modifications of the position and number of sensing areas. Description will focus on differences from the example embodiment shown in FIG. 9, and some redundant description will be omitted.

Referring to FIG. 11, the sensor unit SU may include a hole AH and sensors SC located around the hole AH. The sensor unit SU may include a single sensing area SA. For example, the sensor unit SU may be located in the second non-display area NDA2 and may be formed as a single sensing area SA having a closed curve shape surrounding the hole AH.

The sensors SC located in the sensing area SA may be defined as a sensor group EG. The crack detector 600 may obtain a detected value DS from the sensing area SA to determine whether or not a crack has occurred in the second non-display area NDA2 around the hole AH.

Referring to FIG. 12, the sensor unit SU may include a hole AH and sensors SC located around the hole AH. The sensor unit SU may include a single sensing area SA_1. For example, the sensor unit SU may be located in a part of the second non-display area NDA2 and in a part of the display area DA and may be formed as a single sensing area SA_1 having a closed curve shape surrounding the hole AH.

The sensors SC located in the sensing area SA_1 may be defined as a sensor group EG_1. The crack detector 600 may obtain a detected value DS_1 from the sensing area SA_1 to determine whether or not a crack has occurred in a part of the second non-display area NDA2 and a part of the display area DA adjacent to the second non-display area NDA2.

Referring to FIG. 13, the sensor unit SU may include a hole AH and sensors SC located around the hole AH. The sensor unit SU may include a single sensing area SA_2. For example, the sensor unit SU may be located in the display area DA adjacent to the hole AH and may be formed as a single sensing area SA_2 having a closed curve shape.

The sensors SC located in the sensing area SA_2 may be defined as a sensor group EG_2. The crack detector 600 may obtain a detected value DS_2 from the sensing area SA_2 to determine whether or not a crack has occurred in the display area DA adjacent to the hole AH.

Referring to FIG. 14, the sensor unit SU may include a hole AH and sensors SC located around the hole AH. The sensor unit SU may include a first sensing area SA1_1 and a second sensing area SA2_1 in a bar shape. The first sensing area SA1_1 may be located on one side of the hole AH and may be located on a part of the second non-display area NDA2 and the display area DA contiguous thereto. The second sensing area SA2_1 may be located on the other side of the hole AH and may be located on a part of the second non-display area NDA2 and the display area DA contiguous thereto.

The sensors SC located in the first sensing area SA1_1 may be defined as a first sensor group EG1_1, and the sensors SC located in the second sensing area SA2_1 may be defined as a second sensor group EG2_1. The crack detector 600 may determine whether or not a crack has occurred in the first sensing area SA1_1 by detecting the first detected value DS1_1 from the first sensing area SA1_1. The crack detector 600 may determine whether or not a crack has occurred in the second sensing area SA2_1 by detecting the second detected value DS2_1 from the second sensing area SA2_1. The positions and shape of the sensing areas may be modified in a variety of ways as desired.

Figure 15:
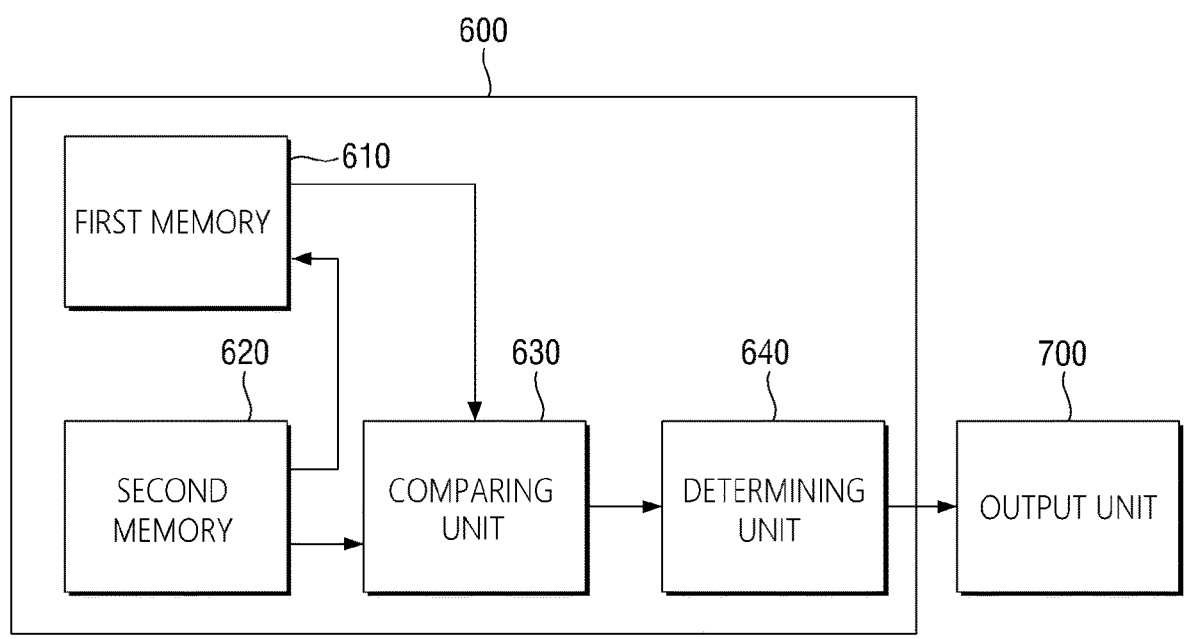
FIG. 15 is a block diagram of a crack detector of a sensor unit according to some example embodiments of the present disclosure.
Figure 16:
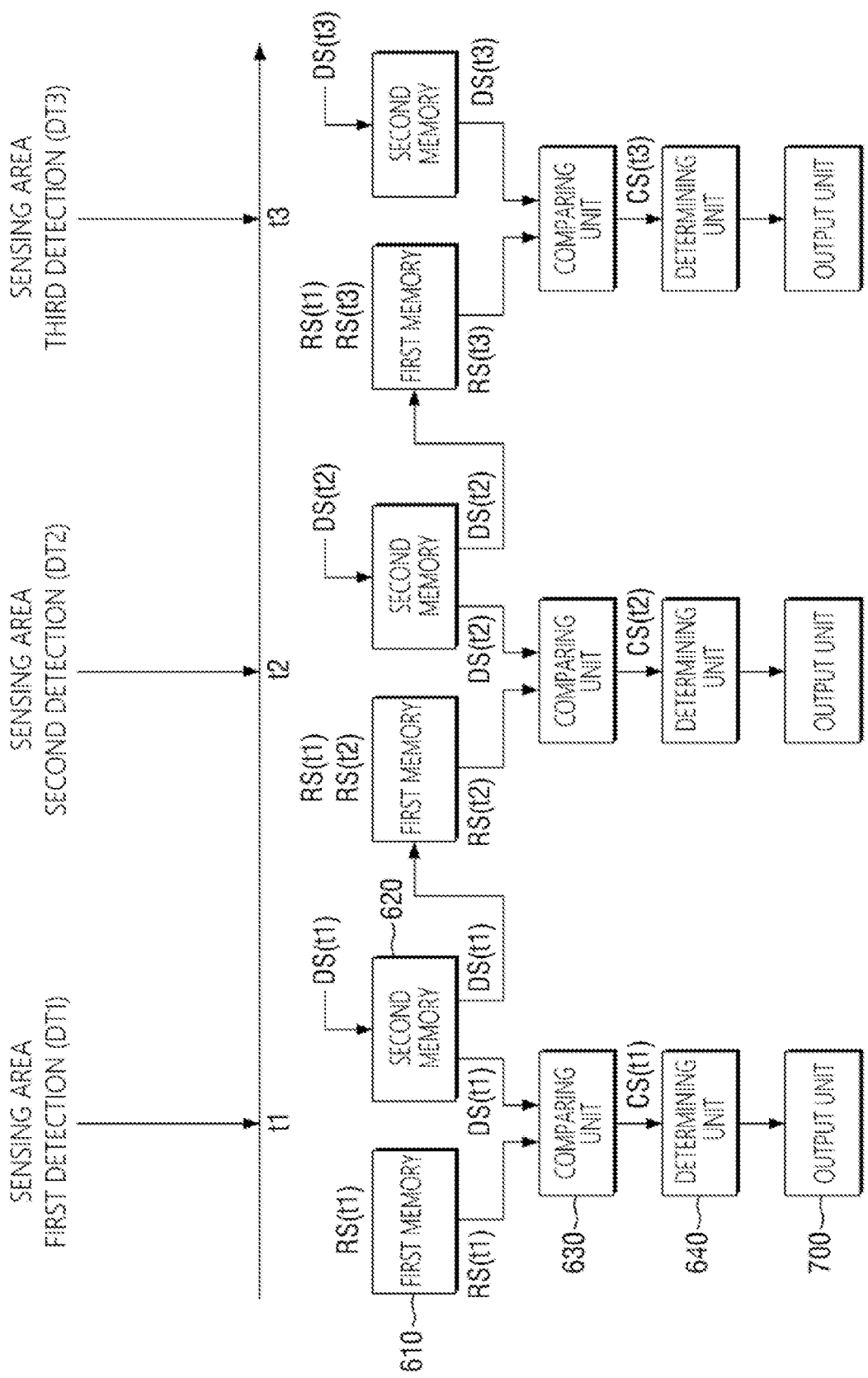
FIG. 16 is a block diagram for illustrating a method for detecting cracks by a sensor unit according to some example embodiments of the present disclosure.

FIG. 15 is a block diagram of a crack detector of a sensor unit according to some example embodiments of the present disclosure. FIG. 16 is a block diagram for illustrating a method for detecting cracks by a sensor unit according to some example embodiments of the present disclosure.

Referring to FIGS. 15 and 16, the crack detector 600 of the sensor unit SU can detect whether or not a crack has occurred and whether or not the crack has been expanded by performing detection at a number of time points.

The crack detector 600 can detect whether or not a crack has occurred by performing detection on the sensing areas SA at a number of time points t1, t2 and t3. For example, first detection DT1 may be performed on the sensing area SA at the first time point t1, second detection DT2 may be performed on the sensing area SA at the second time point t2, and third detection DT3 may be performed on the sensing area SA at the third time point t3.

The crack detector 600 may include a first memory 610, a second memory 620, a comparing unit 630, and a determining unit 640. The configuration of the crack detector 600 of FIG. 15 is identical to that of the crack detector of FIG. 10; and, therefore, some redundant description will be omitted. Hereinafter, changes in the stored values and detected values of the crack detector 600 over time points t1, t2 and t3 will be described in more detail.

At the first time point t1, in the first memory 610, a database on a first reference value RS(t1) of the sensing area SA at the first time point t1 may be stored. For example, the first reference value RS(t1) may be the capacitance of the sensing area SA when no crack has occurred. It is, however, to be understood that the present disclosure is not limited thereto. The first reference value RS(t1) at the first time point t1 may be set to other values as desired. The first memory 610 may transfer the reference value RS(t1) of the sensing area SA at the first time point t1 to the comparing unit 630.

At the first time point t1, in the second memory 620, the detected value DS(t1) at the first time point t1 detected by the first detection DT1 from the sensing area SA may be stored. In addition, the second memory 620 may transmit the detected value DS(t1) at the first time point t1 to the first memory 610 and the comparing unit 630. The first memory 610 may store the detected value DS(t1) at the first time point t1 received from the second memory 620 as the reference value RS(t2) at the second time point t2.

The comparing unit 630 may receive the reference value RS(t1) at the first time point t1 and the detected value DS(t1) at the first time point t1 from the first memory 610 and the second memory 620, respectively, and may calculate the comparison value CS(t1) at the first time point t1 using the received reference value RS(t1) at the first time point t1 and the detected value DS(t1) at the first time point t1. The comparing unit 630 may transfer the calculated comparison value CS(t1) at the first time point t1 to the determining unit 640.

The determining unit 640 may receive the comparison value CS(t1) at the first time point t1 from the comparing unit 630, may compare a predetermined error range with the comparison value CS(t1) at the first time point t1 to determine whether or not a defect is caused by a crack, and may transfer the results to the output unit 700. If the comparison value CS(t1) at the first time point t1 exceeds the predetermined error range, the determining unit 640 determines that the sensing area SA is defective due to a crack. If the comparison value CS(t1) lies within the predetermined error range, the determining unit 640 determines that the sensing area SA is not defective due to a crack.

At the second time point t2, the first memory unit 610 sets the detected value DS(t1) by the first detection DT1 at the first time point t1 stored therein as the reference value RS(t2) at the second time point t2 and may transmit it to the comparing unit 630 together with the first reference value RS(t1) at the first time point t1.

At the second time point t2, in the second memory 620, the detected value DS(t2) at the second time point t2 detected by the second detection DT2 from the sensing area SA may be stored. In addition, the second memory 620 may transmit the detected value DS(t2) at the second time point t2 to the first memory 610 and the comparing unit 630. The first memory 610 may store the detected value DS(t2) at the second time point t2 received from the second memory 620 as the reference value RS(t3) at the third time point t3.

The comparing unit 630 may receive the first reference value RS(t1) at the first time point t1, the reference value RS(t2) at the second time point t2 and the detected value DS(t2) at the second time point t2 from the first memory 610 and the second memory 620 and may calculate the comparison value CS(t2) at the second time point t2 using the received reference value RS(t2) at the second time point t2 and the detected value DS(t2) at the second time point t2.

When the comparison value CS(t2) at the second time point t2 is zero, the comparing unit 630 sets the comparison value CS(t2) at the second time point t2 to zero and transmits it to the determining unit 640. When the comparison value CS(t2) at the second time point t2 is not zero, the comparing unit 630 compares the first reference value RS(t1) at the first time point t1 with the comparison value CS(t2) at the second time point t2 to calculate a value and transmits the value to the determining unit 640 as the comparison value CS(t2) at the second time point t2.

The determining unit 640 may receive the comparison value CS(t2) at the second time point t2 from the comparing unit 630 and may determine that there is no crack or that an existing crack is not expanded if the comparison value CS(t2) at the second time point t2 is zero.

When the comparison value CS(t2) at the second time point t2 is not zero, it is determined that a crack has occurred or that an existing crack has expanded. Then, the comparison value CS(t2) at the second time point t2 (the value obtained by comparing the first reference value RS(t1) at the first time point t1 with the detected value DS(t2) at the second time point t2) may be compared with a predetermined error range, to determine whether or not there is a defect due to the crack. Subsequently, the results may be transmitted to the output unit 700. If the comparison value CS(t2) at the second time point t2 exceeds the predetermined error range, the determining unit 640 determines that the sensing area SA is defective due to a crack. If the comparison value CS(t2) lies within the predetermined error range, the determining unit 640 determines that the sensing area SA is not defective due to a crack.

At the third time point t3, the first memory unit 610 sets the detected value DS(t1) by the second detection DT2 at the second time point t2 stored therein as the reference value RS(t3) at the third time point t3 and may transmit it to the comparing unit 630 together with the first reference value RS(t1) at the first time point t1.

At the third time point t3, in the second memory 620, the detected value DS(t3) at the third time point t3 detected by the third detection DT3 from the sensing area SA may be stored. In addition, the second memory 620 may transmit the detected value DS(t3) at the third time point t3 to the comparing unit 630.

The comparing unit 630 may receive the first reference value RS(t1) at the first time point t1, the reference value RS(t3) at the third time point t3 and the detected value DS(t3) at the third time point t3 from the first memory 610 and the second memory 620 and may calculate the comparison value CS(t3) at the third time point t3 using the received reference value RS(t3) at the third time point t3 and the detected value DS(t3) at the third time point t3. When the comparison value CS(t3) at the third time point t3 is zero, the comparing unit 630 sets the comparison value CS(t3) at the third time point t3 to zero and transmits it to the determining unit 640. When the comparison value CS(t3) at the third time point t3 is not zero, the comparing unit 630 compares the first reference value RS(t1) at the first time point t1 with the comparison value CS(t3) at the third time point t3 to calculate a value and transmits the value to the determining unit 640 as the comparison value CS(t3) at the third time point t3.

The determining unit 640 may receive the comparison value CS(t3) at the third time point t3 from the comparing unit 630 and may determine that there is no crack or that an existing crack is not expanded if the comparison value CS(t3) at the third time point t3 is zero.

When the comparison value CS(t3) at the third time point t3 is not zero, it is determined that a crack has occurred or that an existing crack has expanded. Then, the comparison value CS(t3) at the third time point t3 (the value obtained by comparing the first reference value RS(t1) at the first time point t1 with the detected value DS(t3) at the third time point t3) may be compared with a predetermined error range, to determine whether or not there is a defect due to the crack. Subsequently, the results may be transmitted to the output unit 700. If the comparison value CS(t3) at the third time point t3 exceeds the predetermined error range, the determining unit 640 determines that the sensing area SA is defective due to a crack. If the comparison value CS(t3) lies within the predetermined error range, the determining unit 640 determines that the sensing area SA is not defective due to a crack.

By performing detection on the sensing area SA at a number of time points t1, t2 and t3 as described above, it is possible to determine not only whether or not a crack has occurred but also when the crack has occurred as well as whether or not the crack has been expanded. In the example shown in FIG. 16, detection is performed on the single sensing area SA at a number of time points t1, t2 and t3 to detect if there is a crack. It is, however, to be understood that the present disclosure is not limited thereto. More than one sensing areas may be set as described above, and detection may be performed on each of the sensing areas at a number of time points.

Figure 17:
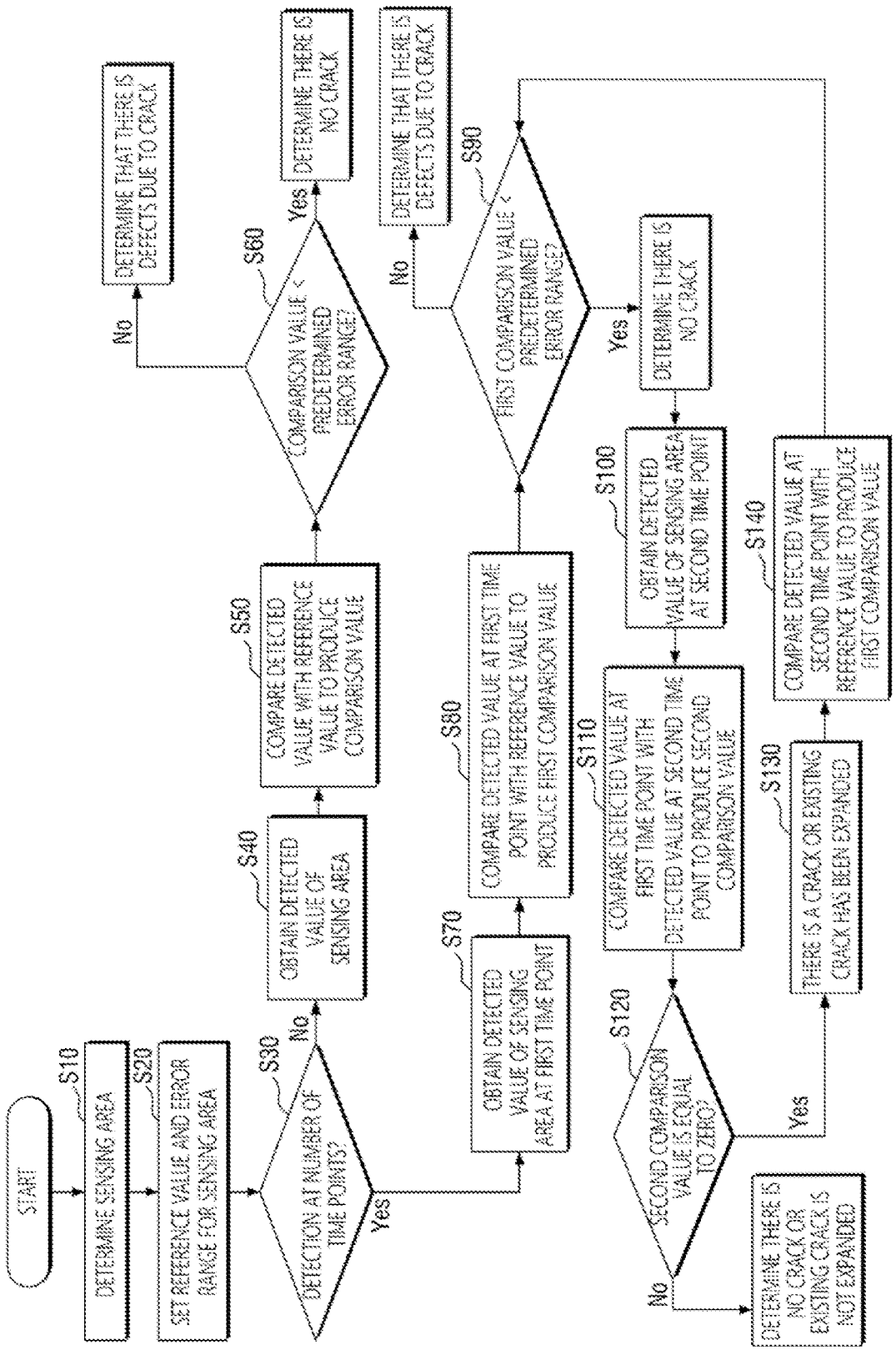
FIG. 17 is a block diagram for illustrating a method for detecting a crack according to some example embodiments of the present disclosure.

FIG. 17 is a block diagram for illustrating a method for detecting a crack according to some example embodiments of the present disclosure. The method for detecting a crack has been described above with reference to FIGS. 10 and 16. Hereinafter, the steps of the method will be described briefly.

Referring to FIGS. 9, 10, 16 and 17, a sensing area SA is determined in a sensor unit SU (step S10).

Subsequently, a reference value RS and an error range for the sensing area SA are determined (step S20). For example, the reference value RS may be stored in a first memory 610, and the error range may be stored in a determining unit 640.

Subsequently, it is determined whether or not to detect a crack at a number of time points or not (step S30).

If it is determined not to detect a crack at a number of time points (No in step S30), a detected value of the sensing area SA is obtained (step S40). For example, the detected value DS is obtained from the sensing area SA, and the detected value DS is stored in the second memory 620.

Subsequently, the comparison value CS is calculated using the received reference value RS and detected value DS (step S50). For example, the reference value RS and the detected value DS from the first memory 610 and the second memory 620, respectively, are transmitted to the comparing unit 630. The comparing unit 630 compares the reference value RS with the detected value DS to calculate the comparison value CS and transmits it to the determining unit 640.

Subsequently, the predetermined error range is compared with the comparison value CS to determine whether or not there is a defect due to a crack (step S60). For example, if the comparison value CS exceeds the predetermined error range, the determining unit 640 determines that the sensing area SA is defective due to a crack. If the comparison value CS lies within the predetermined error range, the determining unit 640 determines that the sensing area SA is not defective due to a crack.

If it is determined to detect a crack at a number of time points (Yes in step S30), a detected value DS(t1) at the first time point t1 is obtained (step S70).

Subsequently, a comparison value CS(t1) at the first time point t1 is calculated using the received reference value RS and detected value DS(t1) at the first time point t1 (step S80).

Subsequently, the predetermined error range is compared with the comparison value CS(t1) to determine whether or not there is a defect due to a crack (step S90).

For example, if the comparison value CS(t1) at the first time point t1 exceeds the predetermined error range, the determining unit 640 determines that the sensing area SA is defective due to a crack. If the comparison value CS(t1) lies within the predetermined error range, the determining unit 640 determines that the sensing area SA is not defective due to a crack.

Subsequently, if the comparison value CS(t1) at the first time point t1 is within the predetermined error range so that it is determined that the sensing area SA is not defective area due to a crack, the detected value DS(t2) of the sensing area SA at the second time point t2 is obtained (step S100).

Subsequently, the comparison value CS(t2) at the second time point t2 is calculated using the detected value DS(t2) at the first time point t1 and the detected value DS(t2) at the second time point t2 (step S110).

Subsequently, it is determined whether or not the comparison value CS(t2) at the second time point t2 is zero (step S120). When the comparison value CS(t2) at the second time point t2 is zero, it is determined that there is no crack or that an existing crack is not expanded.

Subsequently, if the comparison value CS(t2) at the second time point t2 is not zero, it is determined that there is a crack or that an existing crack has been expanded (step S130).

Subsequently, a value obtained by comparing the reference value RS with the detected value DS(t2) at the second time point t2 is again produced as the comparison value CS(t1) at the first time point t1 (step S140).

Subsequently, the predetermined error range is compared with the comparison value CS(t1) at the first time point t1 to determine whether or not there is a defect due to a crack (step S90).

Although the detection is performed on the single sensing area SA at the two time points t1 and t2 in the example shown in FIG. 17, this is merely illustrative. Detection may be performed on two or more sensing areas SA at three or more time points tn.

Figure 18:
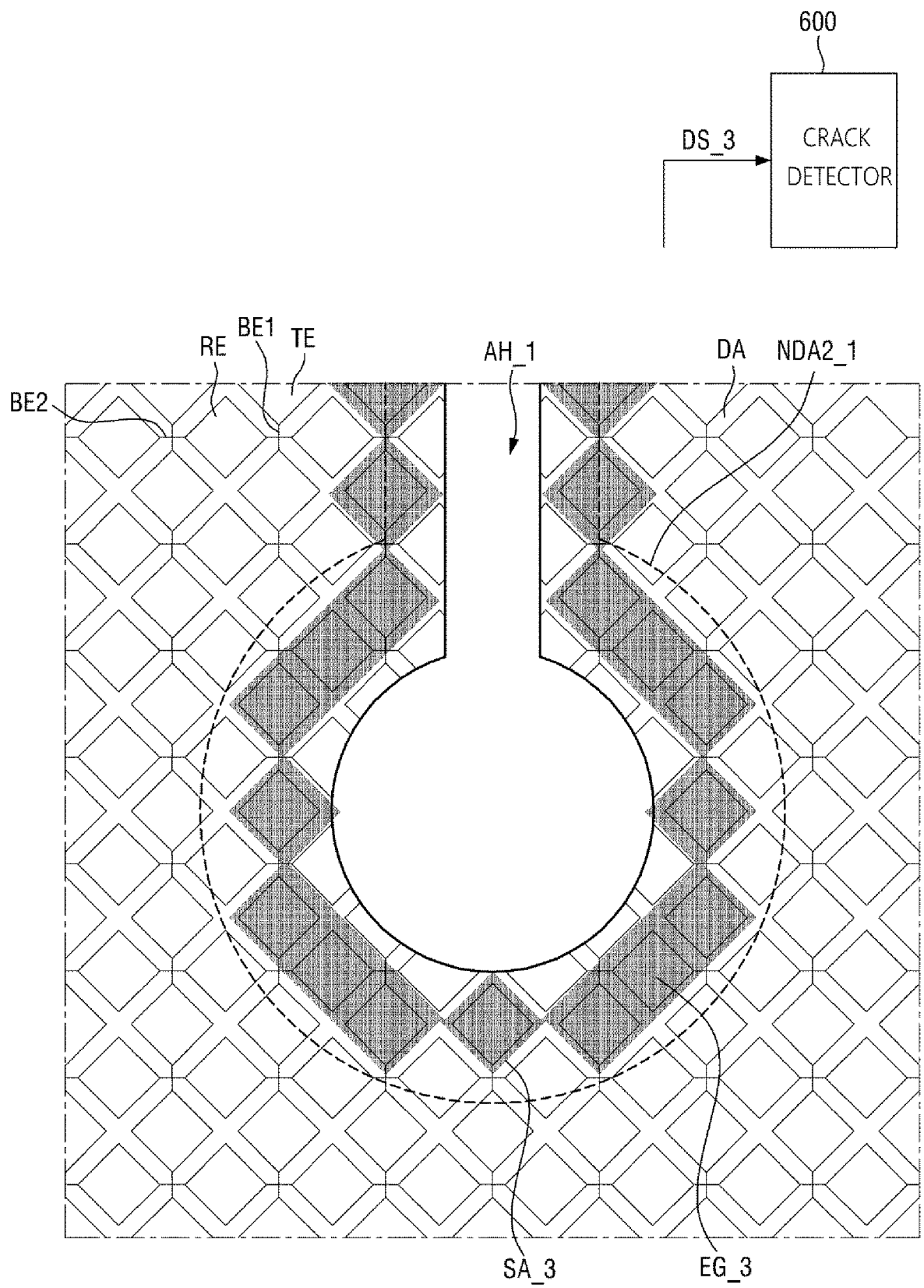
FIG. 18 is a view schematically showing a region in which a hole is formed and a crack detector according to some example embodiments of the present disclosure.
Figure 20:
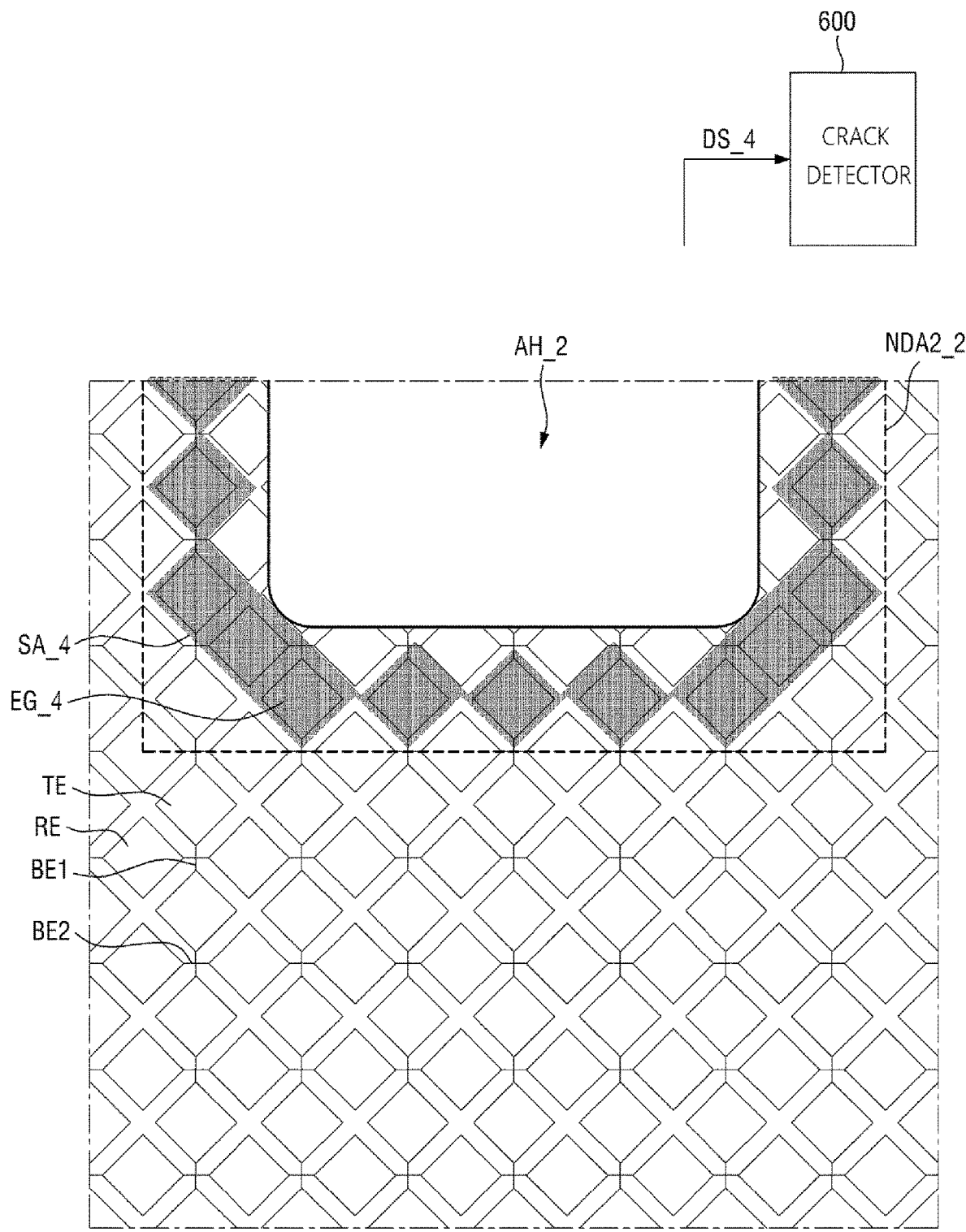
FIG. 20 is a view schematically showing a region in which a hole is formed and a crack detector according to some example embodiments of the present disclosure.
Figure 21:
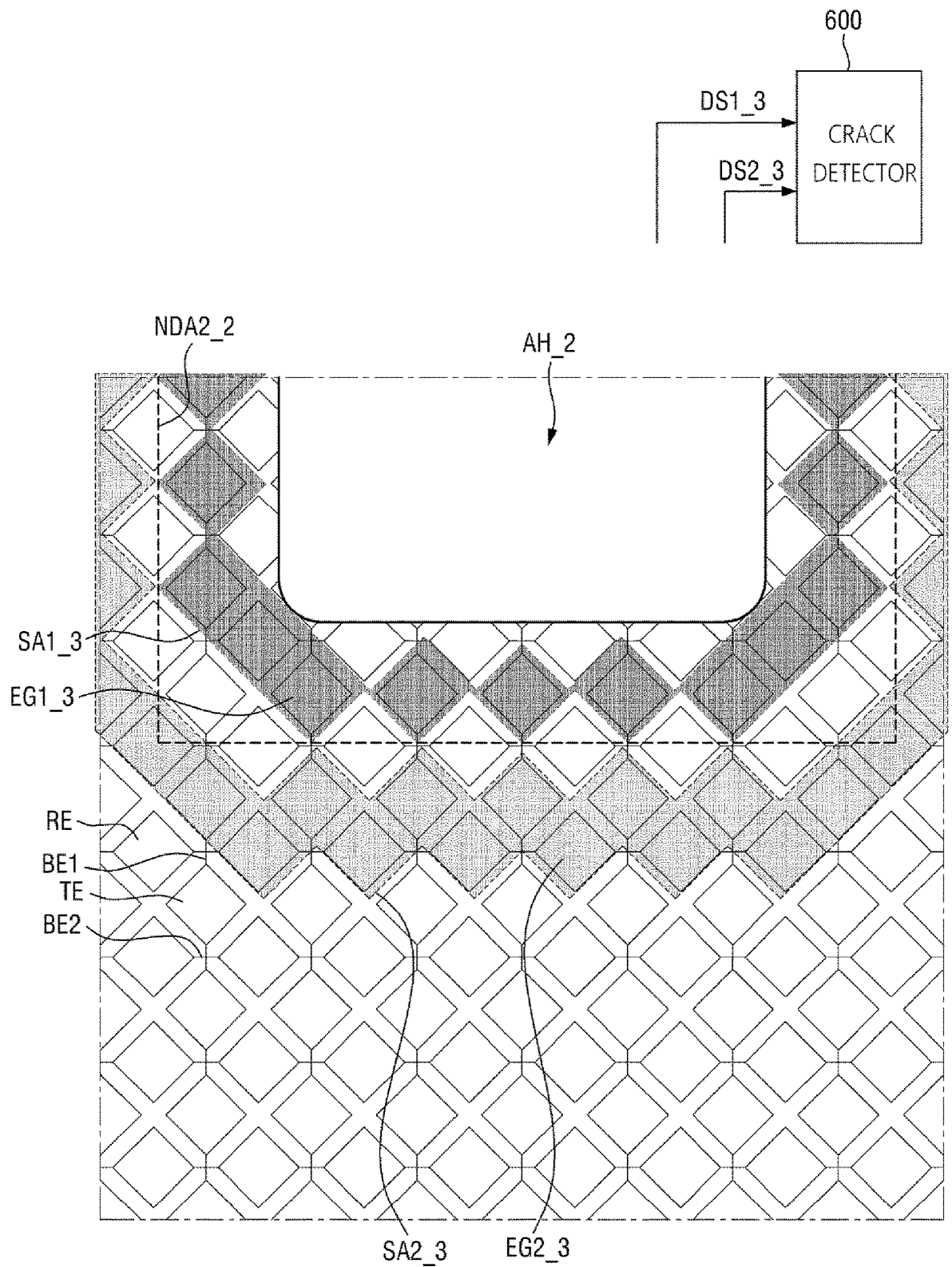
FIG. 21 is a view schematically showing a region in which a hole is formed and a crack detector according to some example embodiments of the present disclosure.
Figure 22:
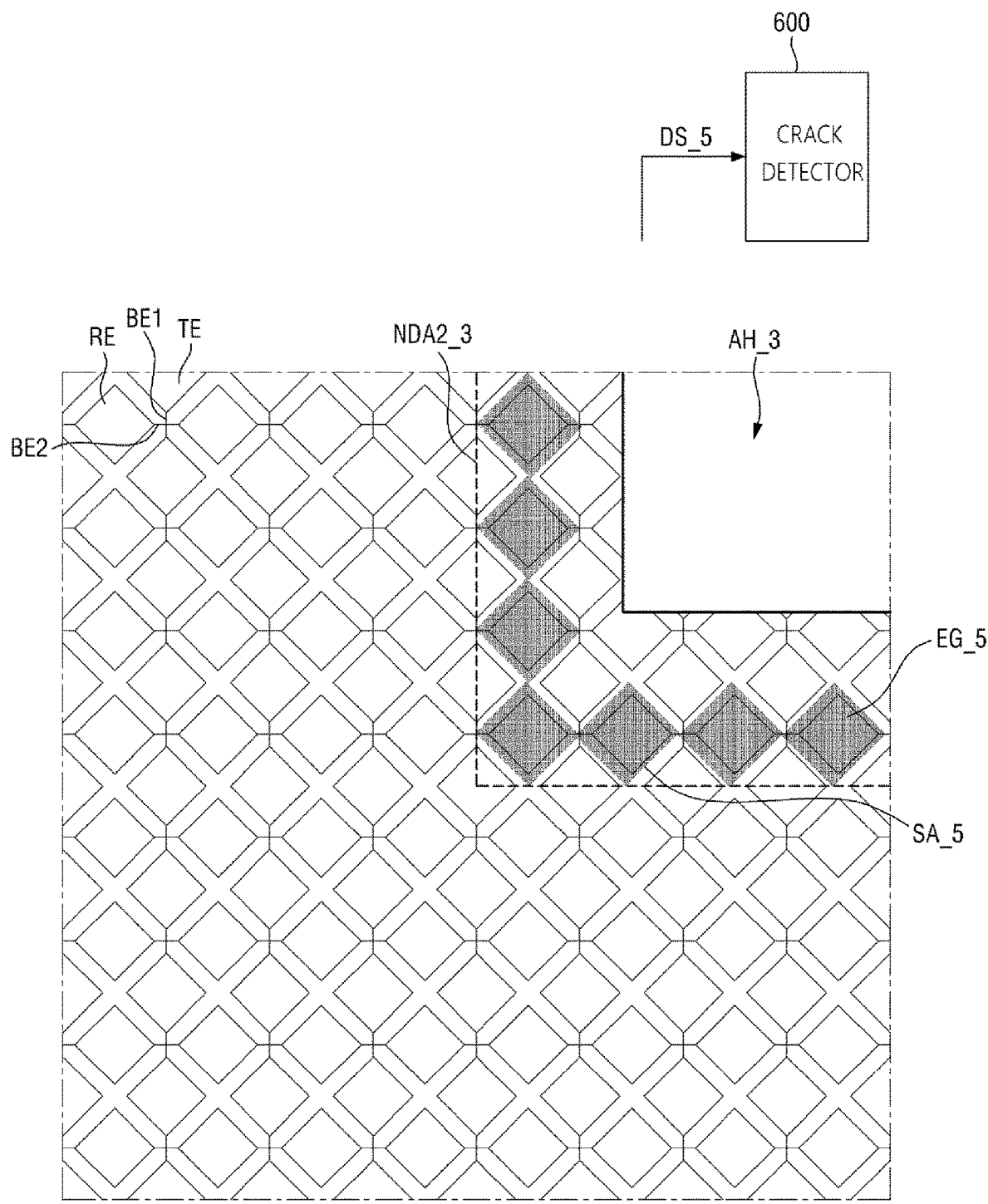
FIG. 22 is a view schematically showing a region in which a hole is formed and a crack detector according to some example embodiments of the present disclosure.

FIG. 18 is a view schematically showing a region in which a hole is formed and a crack detector according to some example embodiments of the present disclosure. FIG. 19 is a view schematically showing a region in which a hole is formed and a crack detector according to some example embodiments of the present disclosure. FIG. 20 is a view schematically showing a region in which a hole is formed and a crack detector according to some example embodiments of the present disclosure. FIG. 21 is a view schematically showing a region in which a hole is formed and a crack detector according to some example embodiments of the present disclosure. FIG. 22 is a view schematically showing a region in which a hole is formed and a crack detector according to some example embodiments of the present disclosure. FIG. 23 is a view schematically showing a region in which a hole is formed and a crack detector according to some example embodiments of the present disclosure. The examples shown in FIGS. 18 to 23 are substantially identical to the example shown in FIG. 9 except that the shapes of the holes and the sensing areas are different; and, therefore, some redundant description may be omitted.

Referring to FIGS. 18 and 19, the sensor unit SU may include a hole AH_1 and a sensing area SA_3. The hole AH_1 may have a circular shape having an opening on its side when viewed from the top. For example, the hole AH_1 may have a circular shape having a bar-shaped hole connected to its one side. In addition, the second non-display area NDA2_1 may have a shape surrounding the hole AH_1.

As shown in FIG. 18, the sensing area SA_3 may be located in the second non-display area NDA2_1 and in a part of the display area DA and may surround the hole AH_1. The sensors SC located in the sensing area SA_3 may be defined as a sensor group EG_3. The crack detector 600 may determine whether or not there is a crack in the sensing area SA_3 by obtaining the detected value DS_3 from the sensor group EG_3 of the sensing area SA_3.

In addition, as shown in FIG. 19, a sensor unit SU may include a first sensing area SA1_2 and a second sensing area SA2_2. The first sensing area SA1_2 may be located in the second non-display area NDA2_1 and in a part of the display area DA and may surround the hole AH_1. The second sensing area SA2_2 may be located in the display area DA and may be located in the shape surrounding the first sensing area SA1_2. The sensors SC located in the first sensing area SA1_1 may be defined as a first sensor group EG1_2, and the sensors SC located in the second sensing area SA2_1 may be defined as a second sensor group EG2_2. The crack detector 600 may obtain the first detected value DS1_2 and the second detected value DS2_2 from the first sensor group EG1_1 and the second sensor group EG2_2 of the first sensing area SA1_1 and the second sensing area SA2_2, respectively, thereby determining whether or not there is a crack in the first sensing area SA1_2 and the second sensing area SA2_2.

Referring to FIGS. 20 and 21, a sensor unit SU may include a hole AH_2. The hole AH_2 may have a notched shape. For example, the hole AH_2 may be formed by notching a part of the sensor unit SU in the form of a quadrangle. It is, however, to be understood that the present disclosure is not limited thereto. The shape of the hole AH_2 of the sensor unit SU may have a variety of notched shapes such as a polygonal shape and an elliptical shape. In addition, the second non-display area NDA2_2 may have a shape surrounding the hole AH_2.

As shown in FIG. 20, the sensing area SA_4 of the sensor unit SU may be located in the second non-display area NDA2_2 and in a part of the display area DA and may surround the hole AH_2. The sensors SC located in the sensing area SA_3 may be defined as a sensor group EG_3. The crack detector 600 may determine whether or not there is a crack in the sensing area SA_4 by obtaining the detected value DS_4 from the sensor group EG_4 of the sensing area SA_4.

In addition, as shown in FIG. 21, a sensor unit SU may include a first detection area SA1_3 and a second detection area SA2_3. The first sensing area SA1_3 may be located in the second non-display area NDA2_2 and in a part of the display area DA and may surround the hole AH_2. The second sensing area SA2_3 may be located in the display area DA and may be located in the shape surrounding the first sensing area SA1_3. The sensors SC located in the first sensing area SA1_3 may be defined as a first sensor group EG1_3, and the sensors SC located in the second sensing area SA2_3 may be defined as a second sensor group EG2_3. The crack detector 600 may obtain the first detected value DS1_3 and the second detected value DS2_3 from the first sensor group EG1_3 and the second sensor group EG2_3 of the first sensing area SA1_3 and the second sensing area SA2_3, respectively, thereby determining whether or not there is a crack in the first sensing area SA1_3 and the second sensing area SA2_3.

Referring to FIGS. 22 and 23, a sensor unit SU may include a hole AH_3. The hole AH_3 may be formed by cutting a corner of the sensor unit SU in an L-shape. It is, however, to be understood that the present disclosure is not limited thereto. The hole AH_3 may be formed by cutting a corner of the sensor unit SU in a variety of shapes such as a polygonal shape and an elliptical shape. In addition, the second non-display area NDA2_3 may have a shape surrounding the hole AH_3.

As shown in FIG. 22, the sensing area SA_5 of the sensor unit SU may be located in the second non-display area NDA2_3 and may surround the hole AH_3. The sensors SC located in the sensing area SA_5 may be defined as a sensor group EG_5. The crack detector 600 may determine whether or not there is a crack in the sensing area SA_5 by obtaining the detected value DS_5 from the sensor group EG_5 of the sensing area SA_5.

In addition, as shown in FIG. 23, a sensor unit SU may include a first detection area SA1_4 and a second detection area SA2_4. The first sensing area SA1_4 may be located in the second non-display area NDA2_3 and may surround the hole AH_3. The second sensing area SA2_4 may be located in the display area DA and may be located in the shape surrounding the first sensing area SA1_4. The sensors SC located in the first sensing area SA1_4 may be defined as a first sensor group EG1_4, and the sensors SC located in the second sensing area SA2_4 may be defined as a second sensor group EG2_4. The crack detector 600 may obtain the first detected value DS1_4 and the second detected value DS2_4 from the first sensor group EG1_4 and the second sensor group EG2_4 of the first sensing area SA1_4 and the second sensing area SA2_4, respectively, thereby determining whether or not there is a crack in the first sensing area SA1_4 and the second sensing area SA2_4.

Although FIGS. 18 to 23 show that the holes AH_1, AH_2 and AH_3 are formed in the sensor unit SU, it is to be understood that the same holes as the holes AH_1, AH_2 and AH_3 of the sensor unit SU may also be formed in the display unit DU of the display device 10 as shown in FIG. 2.

What is claimed is:

1. A sensor unit comprising:
    a hole;
    a sensing area formed around the hole, wherein a plurality of sensors configured to sense a user's touch are in the sensing area; and
    a crack detector configured to output a first crack signal if a comparison value obtained by comparing a detected value from one or more of the sensors with a reference value exceeds an error range,
    wherein the plurality of sensors includes a plurality of first sensor electrodes and a plurality of second sensor electrodes separated from the plurality of first sensor electrodes, and
    the hole is surrounded by at least one of the first sensor electrodes and at least one of the second sensor electrodes in a plan view.

2. The sensor unit of claim 1, wherein the crack detector is configured to output a second crack signal if the comparison value lies within the error range.

3. The sensor unit of claim 2, wherein the crack detector comprises:
    a first memory configured to store the reference value;
    a second memory configured to store the detected value; and
    a comparing unit configured to receive the reference value from the first memory and the detected value from the second memory, and to compare the reference value with the detected value to produce the comparison value.

4. The sensor unit of claim 3, wherein the sensing area comprises a first sensing area having a first distance to the hole and a first sensor located therein, and a second sensing area having a second distance to the hole and a second sensor located therein, and wherein the second distance is larger than the first distance.

5. The sensor unit of claim 4, wherein the crack detector outputs a first crack signal if a first comparison value obtained by comparing a first detected value obtained from the one or more of the sensors in the first sensing area with a first reference value exceeds a first error range, and outputs a second crack signal if the first comparison value lies within the first error range.

6. The sensor unit of claim 5, wherein the crack detector outputs a third crack signal if a second comparison value obtained by comparing a second detected value obtained from the one or more of the sensors in the second sensing area with a second reference value exceeds a second error range, and outputs a fourth crack signal if the second comparison value lies within the second error range.

7. The sensor unit of claim 6, wherein the first reference value is different from the second reference value.

8. The sensor unit of claim 7, wherein the first error range is different from the second error range.

9. A display device comprising:
    a display unit comprising a display area and a non-display area;
    a sensor unit on the display unit, the sensor unit comprising a sensor area and a non-sensor area; and
    a hole penetrating through the display unit and the sensor unit in a thickness direction,
    wherein the sensor unit comprises:
    a sensing area around the hole, wherein a plurality of sensors are located in the sensing area;
    a crack detector configured to output a first crack signal if a comparison value obtained by comparing a detected value obtained from one or more of the sensors with a reference value exceeds and error range;
    a touch driver configured to sense a touch by measuring a change amount of a capacitance,
    wherein the plurality of sensors includes a plurality of first sensor electrodes and a plurality of second sensor electrodes separated from the plurality of first sensor electrodes, and
    the hole is surrounded by at least one of the first sensor electrodes and at least one of the second sensor electrodes in a plan view.

10. The display device of claim 9, wherein the hole comprises a first hole formed in the display unit and a second hole formed in the sensor unit, and
    wherein a region adjacent to the first hole is the non-display area while a region adjacent to the second hole corresponding to the region adjacent to the first hole is the sensor area.

11. The display device of claim 10, wherein the crack detector is configured to output a second crack signal if the comparison value lies within the error range.

12. The display device of claim 11, comprising:
a first memory configured to store the reference value;
a second memory configured to store the detected value; and
a comparing unit configured to receive the reference value from the first memory and the detected value from the second memory, and to compare the reference value with the detected value to produce the comparison value.

13. A method for detecting cracks, the method comprising:
determining a sensing area in a sensor unit comprising a plurality of sensors configured to sense a user's touch and a hole;
obtaining a detected value from the sensing area at a first time point; and
determining whether or not a defect is caused by a crack in the sensing area by using the detected value at the first time point,
wherein the plurality of sensors includes a plurality of first sensor electrodes and a plurality of second sensor electrodes separated from the plurality of first sensor electrodes, and
the hole is surrounded by at least one of the first sensor electrodes and at least one of the second sensor electrodes in a plan view.

14. The method of claim 13, wherein the determining of the sensing area in the sensor unit further comprises setting a reference value and an error range for the sensing area.

15. The method of claim 14, wherein the obtaining of the detected value at the first time point from the sensing area further comprises producing a capacitance or resistance of the sensing area at the first time point using the plurality of sensors.

16. The method of claim 15, wherein the determining of whether or not the defect is caused by the crack in the sensing area by using the detected value at the first time point further comprises producing a first comparison value by comparing the detected value at the first time point of the sensing area with the reference value.

17. The method of claim 16, wherein the determining of whether or not the defect is caused by the crack in the sensing area by using the detected value at the first time point further comprises determining that there is the defect due to the crack if the first comparison value exceeds the error range.

18. The method of claim 17, further comprising:
obtaining a detected value from the sensing area at a second time point; and
determining whether or not there is the defect caused by the crack in the sensing area using the detected value at the second time point.

19. The method of claim 18, wherein the determining of whether or not the defect is caused by the crack in the sensing area by using the detected value at the second time point further comprises producing a second comparison value by comparing the detected value at the second time point of the sensing area with the detected value at the first time point.

20. The method of claim 19, further comprising:
determining that there is no crack or that an existing crack is not expanded if the second comparison value is zero; and
determining whether or not there is the defect caused by the crack using the detected value at the second time point and the reference value if the second comparison value is not zero.

* * * * *